(12) United States Patent
Kim et al.

(10) Patent No.: US 10,580,891 B2
(45) Date of Patent: Mar. 3, 2020

(54) SEMICONDUCTOR DEVICE AND METHOD FOR FABRICATING THE SAME

(71) Applicant: Samsung Electronics Co., Ltd., Suwon-si, Gyeonggi-do (KR)

(72) Inventors: Sung-Soo Kim, Seoul (KR); Gi-Gwan Park, Suwon-si (KR); Sang-Koo Kang, Seoul (KR); Koung-Min Ryu, Hwaseong-si (KR); Jae-Hoon Lee, Hwaseong-si (KR); Tae-Won Ha, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/193,521

(22) Filed: Nov. 16, 2018

(65) Prior Publication Data

US 2019/0088779 A1    Mar. 21, 2019

Related U.S. Application Data

(62) Division of application No. 15/290,240, filed on Oct. 11, 2016, now Pat. No. 10,177,253.

(30) Foreign Application Priority Data

Oct. 14, 2015 (KR) .................. 10-2015-0143541

(51) Int. Cl.
*H01L 29/78* (2006.01)
*H01L 29/40* (2006.01)
*H01L 29/423* (2006.01)
*H01L 29/51* (2006.01)
*H01L 29/66* (2006.01)

(52) U.S. Cl.
CPC ........ *H01L 29/7831* (2013.01); *H01L 29/401* (2013.01); *H01L 29/42364* (2013.01); *H01L 29/513* (2013.01); *H01L 29/66484* (2013.01); *H01L 29/66545* (2013.01); *H01L 29/785* (2013.01); *H01L 29/7843* (2013.01); *H01L 29/7854* (2013.01)

(58) Field of Classification Search
CPC ....... H01L 29/66545; H01L 21/823842; H01L 29/4966
USPC .......... 257/E21.444, E29.255, 407; 438/183, 438/216, 197
See application file for complete search history.

(56) References Cited

U.S. PATENT DOCUMENTS 6,403,426 B1    6/2002  Montree et al.
7,148,099 B2 *  12/2006 Datta ................ H01L 21/26586
                                                     438/216

(Continued)

FOREIGN PATENT DOCUMENTS

KR    10-0151184 B1    12/1998
KR    10-2011-0047883 A    5/2011

*Primary Examiner* — Jonathan Han
(74) *Attorney, Agent, or Firm* — Harness, Dickey & Pierce, P.L.C.

(57) ABSTRACT

A semiconductor device capable of adjusting profiles of a gate electrode and a gate spacer by implanting or doping an element semiconductor material into an interlayer insulating layer may be provided. The semiconductor device may include a gate spacer on a substrate, the gate spacer defining a trench, a gate electrode filling the trench, and an interlayer insulating layer on the substrate, which surrounds the gate spacer, and at least a portion of which includes germanium.

14 Claims, 26 Drawing Sheets

(56) References Cited

U.S. PATENT DOCUMENTS

| | | | |
|---|---|---|---|
| 7,422,936 B2* | 9/2008 | Barns | H01L 21/28079 |
| | | | 257/E21.202 |
| 7,939,895 B2* | 5/2011 | Fukasaku | H01L 21/28097 |
| | | | 257/204 |
| 8,076,735 B2* | 12/2011 | Lin | H01L 21/28088 |
| | | | 257/310 |
| 8,080,463 B2 | 12/2011 | Iwasawa et al. | |
| 8,431,453 B2 | 4/2013 | Huang et al. | |
| 8,525,232 B2* | 9/2013 | Nogami | H01L 21/823842 |
| | | | 257/197 |
| 8,748,239 B2* | 6/2014 | Kim | H01L 21/28123 |
| | | | 257/369 |
| 8,772,143 B2 | 7/2014 | Cheng et al. | |
| 8,835,312 B2* | 9/2014 | Kim | H01L 21/823885 |
| | | | 438/653 |
| 8,962,412 B2 | 2/2015 | Cheng et al. | |
| 2007/0105297 A1* | 5/2007 | Jeong | H01L 21/76801 |
| | | | 438/197 |
| 2009/0017597 A1 | 1/2009 | Zhao et al. | |
| 2010/0197111 A1 | 8/2010 | Seo et al. | |
| 2015/0187939 A1 | 7/2015 | Wu et al. | |

\* cited by examiner

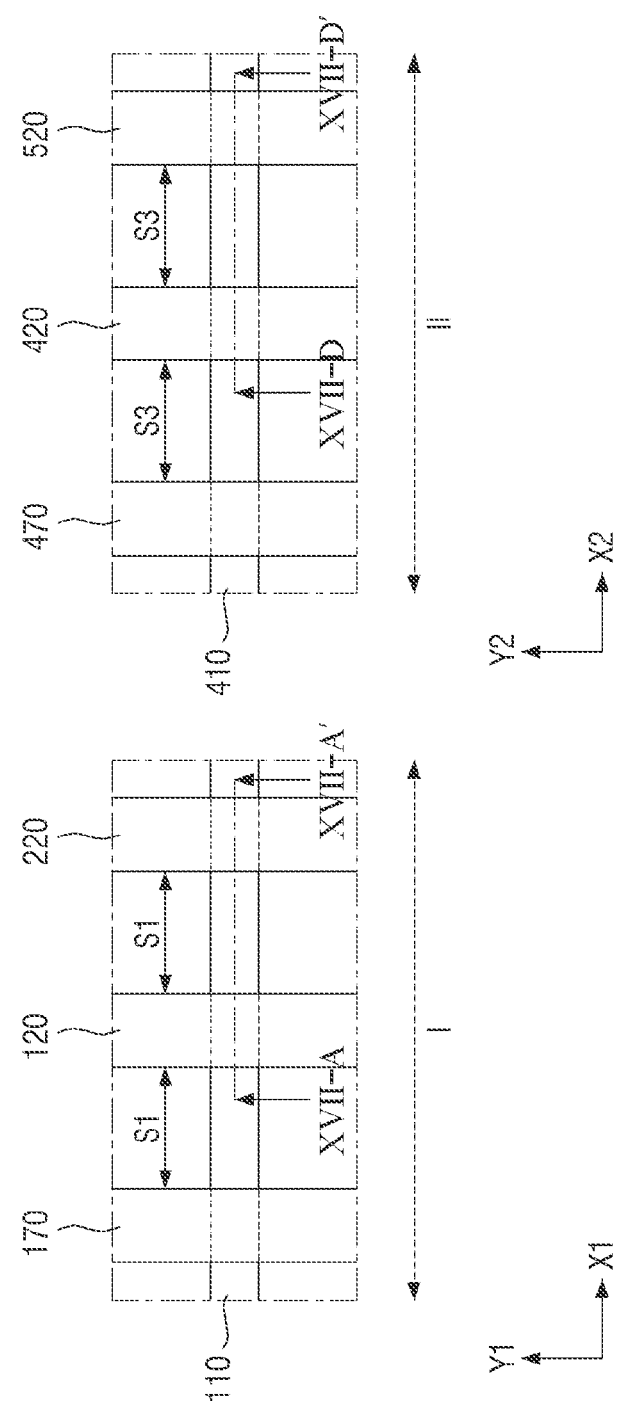

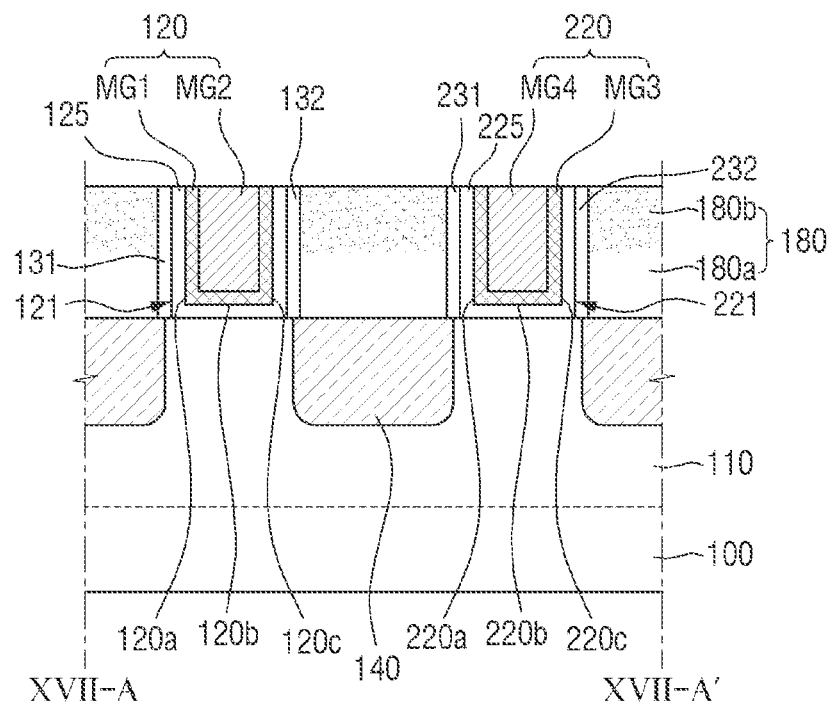
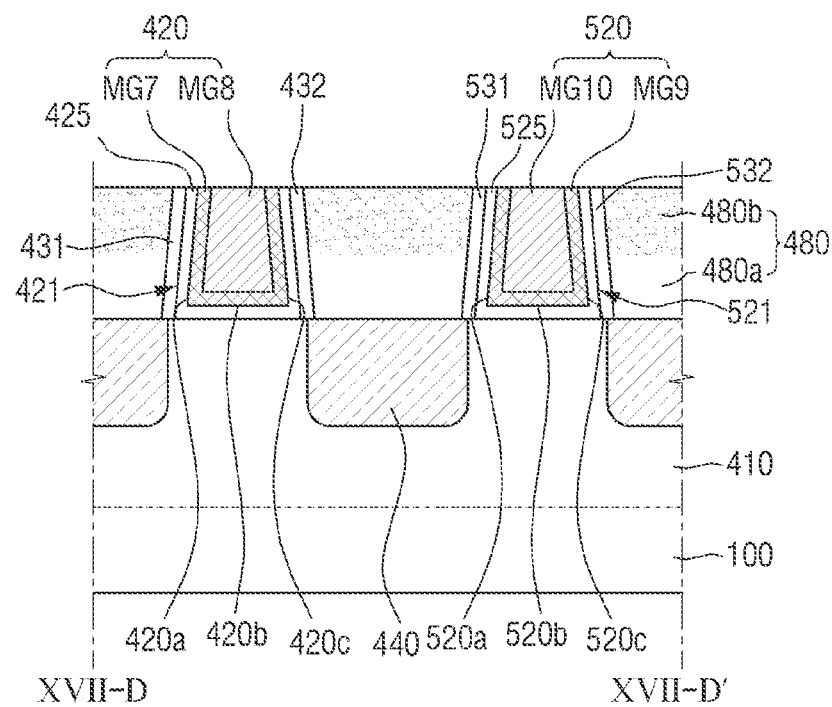

SEMICONDUCTOR DEVICE AND METHOD FOR FABRICATING THE SAME

CROSS-REFERENCE TO RELATED APPLICATION

This application is a divisional of U.S. application Ser. No. 15/290,240, filed on Oct. 11, 2016, which claims priority to Korean Patent Application No. 10-2015-0143541, filed on Oct. 14, 2015 in the Korean Intellectual Property Office, the entire contents of each of which are incorporated herein by reference.

BACKGROUND

1. Technical Field

The present disclosure relates to semiconductor devices and/or methods for fabricating the same.

2. Description of the Related Art

For semiconductor device density enhancement, the multigate transistor has been suggested as one of the scaling technologies. In the multigate transistor, a multi-channel active pattern (or silicon body) in a fin or nanowire shape is formed on a substrate and gates are formed on a surface of the multi-channel active pattern.

Such multigate transistor allows relatively easy scaling because it uses a three-dimensional channel. Further, such multigate transistor tends to have an enhanced current control capability without increasing the gate length of the multigate transistor. Thus, short channel effect (SCE), which is the phenomenon that the electric potential of the channel region is influenced by the drain voltage, can be effectively suppressed.

SUMMARY

Some example example embodiments of the present disclosure provide semiconductor devices capable of adjusting profiles of a gate electrode and/or a gate spacer by implanting or doping an element semiconductor material into an interlayer insulating layer.

Some example example embodiments of the present disclosure provide methods for fabricating a semiconductor device capable of adjusting profiles of a gate electrode and/or a gate spacer by implanting or doping an element semiconductor material into an interlayer insulating layer.

Example example embodiments of the present disclosure are not limited to the example example embodiments mentioned herein, and example example embodiments that are not mentioned herein can be clearly understood to those skilled in the art based on the description provided below.

According to an example example embodiment of the present inventive concepts, a semiconductor device includes a gate spacer on a substrate, the gate spacer defining a trench, a gate electrode filling the trench, and an interlayer insulating layer on the substrate, which surrounds the gate spacer, the interlayer insulating layer including a first portion having germanium.

In some example embodiments of the present inventive concepts, a width of the trench may be substantially same with increasing distance from the substrate.

In some example embodiments of the present inventive concepts, a width of the trench may decrease with increasing distance from the substrate.

In some example embodiments of the present inventive concepts, the gate electrode may include a first sidewall and a second sidewall opposed to each other, and the first sidewall of the gate electrode and the second sidewall of the gate electrode may have slopes at an acute angle with a bottom surface of the gate electrode.

In some example embodiments of the present inventive concepts, the gate electrode may include a first sidewall and a second sidewall opposed to each other, the first sidewall of the gate electrode may have a slope at a right angle with a bottom surface of the gate electrode, and the second sidewall of the gate electrode may have a slope at an acute angle with the bottom surface of the gate electrode.

In some example embodiments of the present inventive concepts, the interlayer insulating layer may include a second portion, which does not include the germanium.

In some example embodiments of the present inventive concepts, the interlayer insulating layer may include a lower portion and an upper portion, the upper portion of the interlayer insulating layer may include the first portion of the interlayer insulating layer, and the lower portion of the interlayer insulating layer may include the second portion of the interlayer insulating layer, the second portion not including the germanium.

In some example embodiments of the present inventive concepts, a concentration of the germanium in the first portion of the interlayer insulating layer may increase with increasing distance from the substrate.

In some example embodiments of the present inventive concepts, an upper surface of the interlayer insulating layer and the upper surface of the gate electrode may be positioned at a same plane.

In some example embodiments of the present inventive concepts, the semiconductor device may further comprise a fin-type pattern protruding from the substrate. The gate electrode may be on the fin-type pattern and intersects the fin-type pattern.

In some example embodiments of the present inventive concepts, the semiconductor device may further comprise a source/drain region on the substrate, the source/drain region being adjacent to the gate electrode, and an etch-stop layer extending along respective sidewalls of the gate spacer and an upper surface of the source/drain region.

In some example embodiments of the present inventive concepts, the interlayer insulating layer may be a single layer.

According to an example embodiment of the present inventive concepts, a semiconductor device includes a substrate including a first region and a second region, a first gate spacer on the first region, the first gate spacer defining a first trench, a second gate spacer on the second region, the second gate spacer defining a second trench, a first gate electrode filling the first trench, a second gate electrode filling the second trench, a first interlayer insulating layer on the substrate, which surrounds the first gate spacer, and a second interlayer insulating layer on the substrate, which surrounds the second gate spacer. At least one of the first interlayer insulating layer or the second interlayer insulating layer may include germanium.

In some example embodiments of the present inventive concepts, the first interlayer insulating layer may include the germanium, and the second interlayer insulating layer may not include the germanium.

In some example embodiments of the present inventive concepts, with increasing distance from the substrate, a width of the first trench may be substantially same, and a width of the second trench may increase.

In some example embodiments of the present inventive concepts, with increasing distance from the substrate, a width of the first trench may decrease, and a width of the second trench may increase.

In some example embodiments of the present inventive concepts, the first interlayer insulating layer and the second interlayer insulating layer each may include a lower portion and an upper portion, the upper portion of the first interlayer insulating layer and the upper portion of the second interlayer insulating layer each may include the germanium, and the lower portion of the first interlayer insulating layer and the lower portion of the second interlayer insulating layer each do not include the germanium.

In some example embodiments of the present inventive concepts, a thickness of the upper portion of the first interlayer insulating layer may be less than a thickness of the upper portion of the second interlayer insulating layer.

In some example embodiments of the present inventive concepts, with increasing distance from the substrate, a width of the first trench may be substantially same, and a width of the second trench may decrease.

In some example embodiments of the present inventive concepts, an amount of the germanium included in the upper portion of the first interlayer insulating layer may be less than an amount of the germanium included in the upper portion of the second interlayer insulating layer.

In some example embodiments of the present inventive concepts, with increasing distance from the substrate, a width of the first trench may be substantially same, and a width of the second trench may decrease.

In some example embodiments of the present inventive concepts, the semiconductor device may further include a first fin-type pattern and a second fin-type pattern both protruding from the substrate. The first gate electrode may intersect with the first fin-type pattern, and the second gate electrode may intersect with the second fin-type pattern.

According to an example embodiment of the present inventive concepts, a semiconductor device includes a substrate including a first region and a second region, a first gate spacer on the first region, the first gate spacer defining a first trench, a sidewall of the first trench having a slope of a first sign with respect to a bottom surface of the first trench, a second gate spacer on the second region, the second gate spacer defining a second trench, a sidewall of the second trench having a slope of a second sign with respect to a bottom surface of the second trench, the second sign being opposite to the first sign, a first gate electrode filling the first trench, a second gate electrode filling the second trench, and an interlayer insulating layer on the substrate, which surrounds the first gate spacer and the second gate spacer, the interlayer insulating layer including a first portion having an element semiconductor material.

In some example embodiments of the present inventive concepts, the element semiconductor material may include at least one of germanium (Ge) or silicon (Si).

In some example embodiments of the present inventive concepts, the interlayer insulating layer may include a second portion which does not include the element semiconductor material.

In some example embodiments of the present inventive concepts, a thickness of the first portion of the interlayer insulating layer in the first region may be different from a thickness of the first portion of the interlayer insulating layer in the second region.

In some example embodiments of the present inventive concepts, an amount of the element semiconductor material included in the first portion of the interlayer insulating layer in the first region may be different from an amount of the element semiconductor material included in the first portion of the interlayer insulating layer in the second region.

In some example embodiments of the present inventive concepts, the semiconductor device may further include a third gate electrode on the first region, the third gate electrode being adjacent to the first gate electrode, and a fourth gate electrode on the second region, the fourth gate electrode being adjacent to the second gate electrode. A spacing between a bottom surface of the first gate electrode and a bottom surface of the third gate electrode may be different from a spacing between a bottom surface of the second gate electrode and a bottom surface of the fourth gate electrode.

In some example embodiments of the present inventive concepts, a thickness of the first portion of the interlayer insulating layer in the first region may be substantially same as a thickness of the first portion of the interlayer insulating layer in the second region.

According to an example embodiment of the present inventive concepts, a method for fabricating a semiconductor device includes forming a dummy gate electrode on a substrate, forming a pre-interlayer insulating layer to cover the dummy gate electrode, implanting an element semiconductor material into the pre-interlayer insulating layer, performing a thermal treatment on the pre-interlayer insulating layer implanted with the element semiconductor material; and planarizing the thermally-treated pre-interlayer insulating layer to form an interlayer insulating layer such that an upper surface of the dummy gate electrode is exposed by the interlayer insulating layer.

In some example embodiments of the present inventive concepts, the element semiconductor material may include at least one of germanium (Ge) or silicon (Si).

In some example embodiments of the present inventive concepts, the performing a thermal treatment may be performed more than once.

In some example embodiments of the present inventive concepts, the method may further include removing the dummy gate electrode to form a trench, and forming a gate electrode to fill the trench.

According to an example embodiment of the present inventive concepts, a semiconductor device includes a first gate electrode on a substrate, a second gate electrode on the substrate, the second gate electrode adjacent to and spaced apart from the first gate electrode, a pair of first gate spacers at respective sides of the first gate electrode, a pair of second gate spacers at respective sides of the second gate electrode, a first interlayer insulating layer on the substrate, the first interlayer insulating layer between one of the pair of first gate spacers and one of the pair of second gate spacers opposing the one of the pair of first gate spacers, a first portion of the first interlayer insulating layer including an oxidized element semiconductor material.

In some example embodiments of the present inventive concepts, the first portion of the first interlayer insulating layer may be an upper portion of the first interlayer insulating layer or a lower portion of the first interlayer insulating layer.

In some example embodiments of the present inventive concepts, the first portion of the first interlayer insulating layer may be an entirety of the first interlayer insulating layer.

In some example embodiments of the present inventive concepts, the oxidized element semiconductor material may include at least one of germanium (Ge) or silicon (Si).

In some example embodiments of the present inventive concepts, the semiconductor device may further include a third gate electrode on the substrate, a fourth gate electrode on the substrate, the fourth gate electrode adjacent to and spaced apart from the third gate electrode, a pair of third gate spacers at respective sides of the third gate electrode, a pair of fourth gate spacers at respective sides of the fourth gate electrode, a second interlayer insulating layer on the substrate, the second interlayer insulating layer between one of the pair of third gate spacers and one of the pair of fourth gate spacers opposing the one of the pair of third gate spacers.

In some example embodiments of the present inventive concepts, a first portion of the second interlayer insulating layer may include the oxidized element semiconductor material.

In some example embodiments of the present inventive concepts, an amount of the oxidized element semiconductor material included in the first portion of the first interlayer insulating layer may be different from an amount of the oxidized element semiconductor material included in the first portion of the second interlayer insulating layer.

In some example embodiments of the present inventive concepts, a thickness of the first portion of the first interlayer insulating layer may be different from a thickness of the first portion of the second interlayer insulating layer.

In some example embodiments of the present inventive concepts, the second interlayer insulating layer may not include the oxidized element semiconductor material.

In some example embodiments of the present inventive concepts, the second gate electrode and the third gate electrode may be a same electrode provided between the first gate electrode and the fourth gate electrode.

In some example embodiments of the present inventive concepts, slopes of the first, second, third, and fourth gate spacers or slopes of sidewalls of the first, second, third, and fourth gate electrodes may include both a positive sign and a negative sign.

BRIEF DESCRIPTION OF THE DRAWINGS

The above and other features and advantages of the present disclosure will become more apparent to those of ordinary skill in the art by describing in detail example embodiments thereof with reference to the accompanying drawings, in which:

FIG. 16 is a top view illustrating a semiconductor device according to some example embodiments;

FIGS. 20A and 20B are cross-sectional views taken along lines XVII-A-XVII-A' and XVII-D-XVII-D' of FIG. 16, according to an example embodiment;

DETAILED DESCRIPTION

Figure 1:
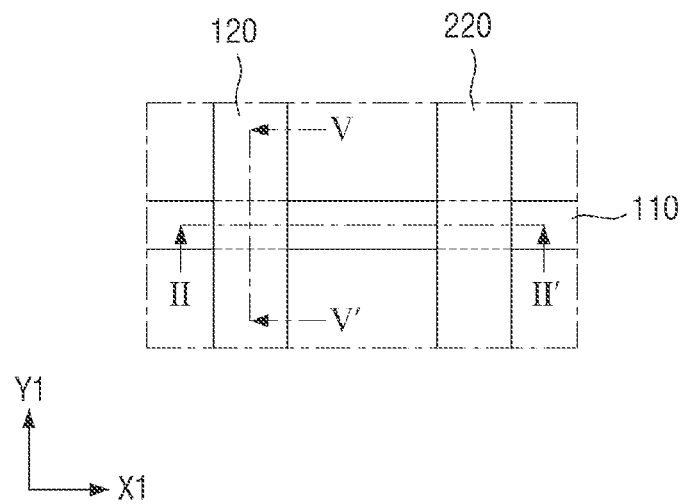
FIG. 1 is a top view illustrating a semiconductor device according to an embodiment.

Advantages and features of semiconductor devices and methods of fabricating the same according to the present inventive concepts may be understood more readily by reference to the following detailed description of example embodiments and the accompanying drawings. The present inventive concepts may, however, be embodied in many different forms and should not be construed as being limited to the example embodiments set forth herein. Rather, these example embodiments are provided so that this disclosure will be thorough and complete and will fully convey the inventive concepts to those skilled in the art, and the present inventive concepts will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The terminology used herein is for the purpose of describing particular example embodiments only and is not intended to be limiting of example embodiments. The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of example embodiments.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless defined otherwise, all technical and scientific terms used herein have the same meaning as commonly understood by one of ordinary skill in the art to which these inventive concepts belong. It is noted that the use of any and all examples, or example terms provided herein are intended merely to better illuminate the inventive concepts and are not a limitation on the scope of the inventive concepts unless otherwise specified. Further, unless defined otherwise, all terms defined in generally used dictionaries may not be overly interpreted.

Hereinbelow, a semiconductor device according to some example embodiments will be explained with reference to FIGS. 1 to 6B.

Figure 2:
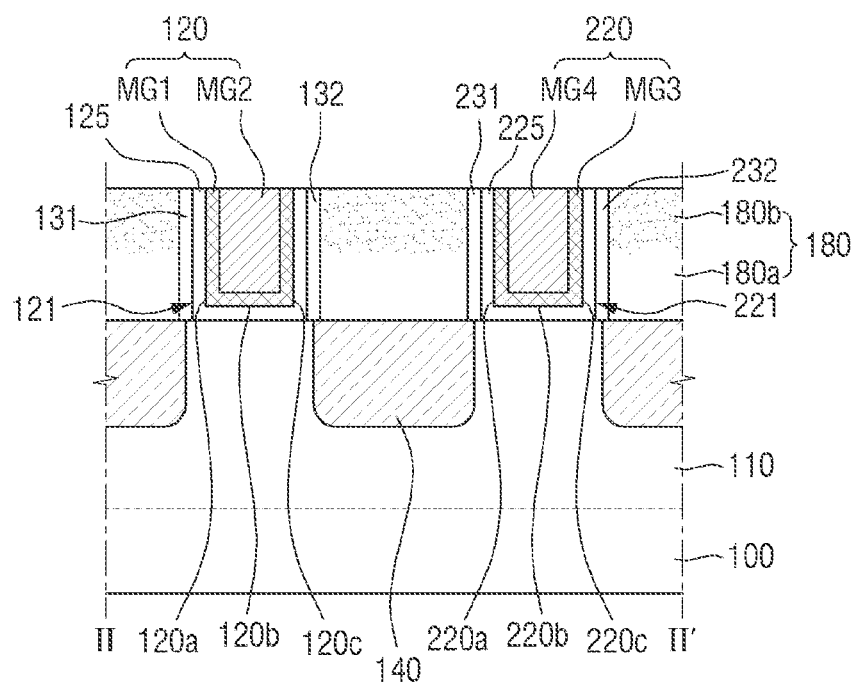
FIG. 2 is a cross-sectional view taken along line II-II' of FIG. 1.
Figure 3A:
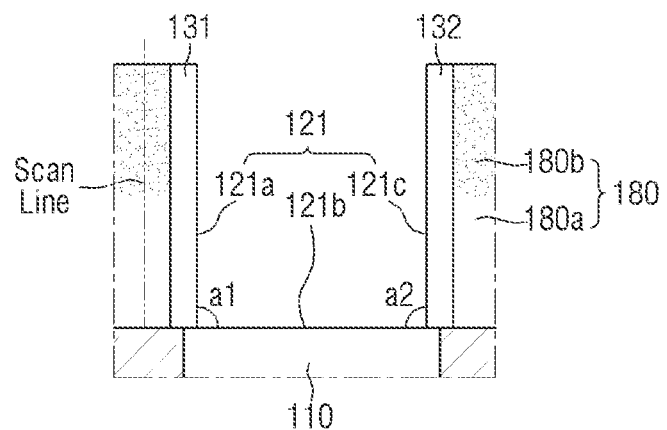
FIG. 3A is a view illustrating a first gate spacer from which a first gate electrode of FIG. 2 is omitted.
Figure 3B:
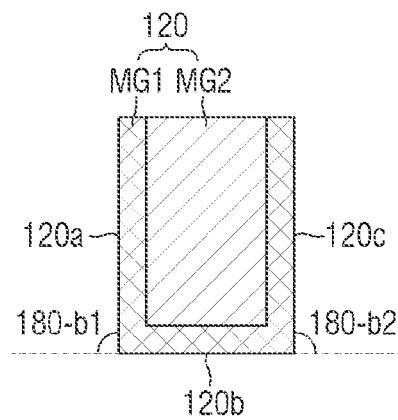
FIG. 3B illustrates the first gate electrode of FIG. 2 separately.
Figure 4:
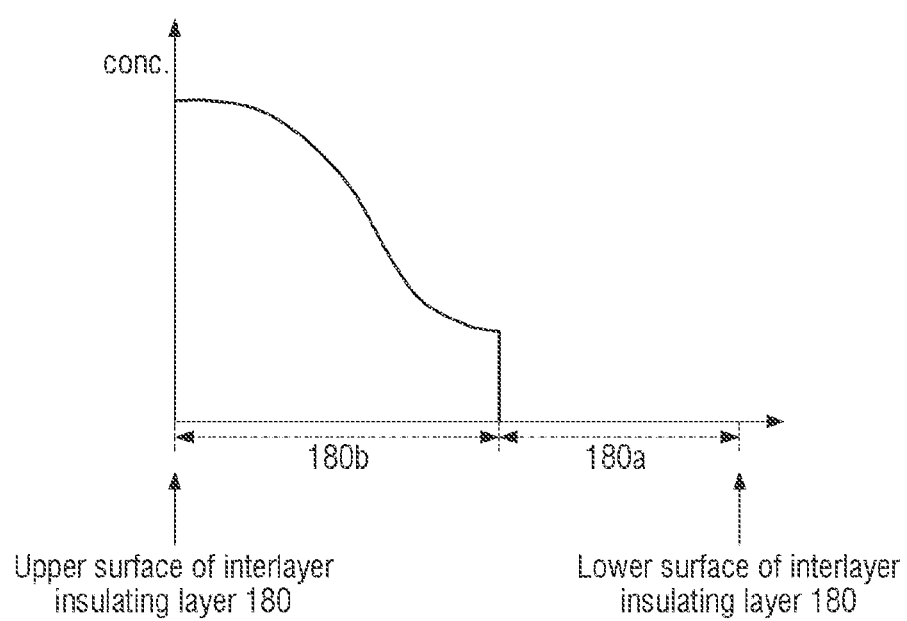
FIG. 4 schematically illustrates a concentration of an element semiconductor material along a scan line of FIG. 3A.

FIG. 1 is a top view illustrating a semiconductor device according to an example embodiment. FIG. 2 is a cross-sectional view taken along line II-II' of FIG. 1. FIG. 3A is a view illustrating a first gate spacer from which a first gate electrode of FIG. 2 is omitted. FIG. 3B illustrates the first gate electrode of FIG. 2 separately. FIG. 4 schematically illustrates a concentration of an element semiconductor material along a scan line of FIG. 3A. FIGS. 5A to 5D are cross-sectional views taken along line V-V' of FIG. 1. FIGS. 6A and 6B are cross-sectional views illustrating stress-relationship between an interlayer insulating layer and a gate spacer according to doping of an element semiconductor material.

Although the drawings regarding a semiconductor device according to the present example embodiment illustrates a fin-type transistor (FinFET) comprising a channel region in a fin-type pattern shape, example embodiments are not limited thereto. In some example embodiments, the semiconductor device may include a tunneling transistor (FET), a transistor comprising nanowire, a transistor comprising nano-sheet, or a three-dimensional (3D) transistor. Further, a semiconductor device according to some example embodiments may include, for example, a bipolar junction transistor, or a laterally diffused metal oxide semiconductor (LDMOS) transistor.

Moreover, while a semiconductor device according to the present example embodiment illustrates a multi-channel transistor using fin-type pattern, the semiconductor device may be a planar transistor as well.

Referring to FIGS. 1 to 5D, the semiconductor device according to the example embodiment includes a first fin-type pattern 110, a first gate electrode 120, a second gate electrode 220, first gate spacers 131, 132, second gate spacers 231, 232, and a first interlayer insulating layer 180.

The substrate 100 may be a bulk silicon or a silicon-on-insulator (SOI). Alternatively, the substrate 100 may be a silicon substrate, or may include other substance such as, for example, silicon germanium, silicon germanium on insulator (SGOI), indium antimonide, lead telluride compound, indium arsenide, indium phosphide, gallium arsenide, or gallium antimonide, but not limited thereto.

The first fin-type pattern 110 may protrude from the substrate 100. The first fin-type pattern 110 may extend longitudinally in a first direction X1.

The first fin-type pattern 110 refers to an active pattern used in a multigate transistor. Accordingly, the first fin-type pattern 110 may be formed as the channels are connected with each other along three surfaces of the fin, or alternatively, the channels may be formed on two opposing surfaces of the fin.

The first fin-type pattern 110 may be a part of the substrate 100. According to some example embodiments, the first fin-type pattern 110 may include an epitaxial layer grown on the substrate 100.

The first fin-type pattern 110 may include an element semiconductor material, for example, silicon or germanium. According to some example embodiments, the first fin-type pattern 110 may include a compound semiconductor, for example, IV-IV group compound semiconductor or III-V group compound semiconductor.

For example, the first fin-type pattern 110 may include the IV-IV group compound semiconductor of a binary compound or a ternary compound, which includes, for example, at least two or more of carbon (C), silicon (Si), germanium (Ge), and tin (Sn), or the above-mentioned binary or ternary compound doped with IV group element.

For example, the first fin-type pattern 110 may include the III-V group compound semiconductor of a binary compound, a ternary compound or a quaternary compound, which is formed by a combination of a III group element (e.g., at least one of aluminum (Al), gallium (Ga), or indium (In)) with a V group element (e.g., at least one of phosphorus (P), arsenic (As) or antimony (Sb)).

In the semiconductor device according to the present example embodiments, it is assumed that the first fin-type pattern 110 includes silicon.

A first field insulating layer 105 may be formed on the substrate 100. The first field insulating layer 105 may partially cover a side surface of the first fin-type pattern 110. Accordingly, an upper surface of the first fin-type pattern 110 may protrude upward higher than an upper surface of the first field insulating layer 105 disposed on the long side of the first fin-type pattern 110. The first fin-type pattern 110 may be defined by the first field insulating layer 105 on the substrate 100.

Figure 5A:
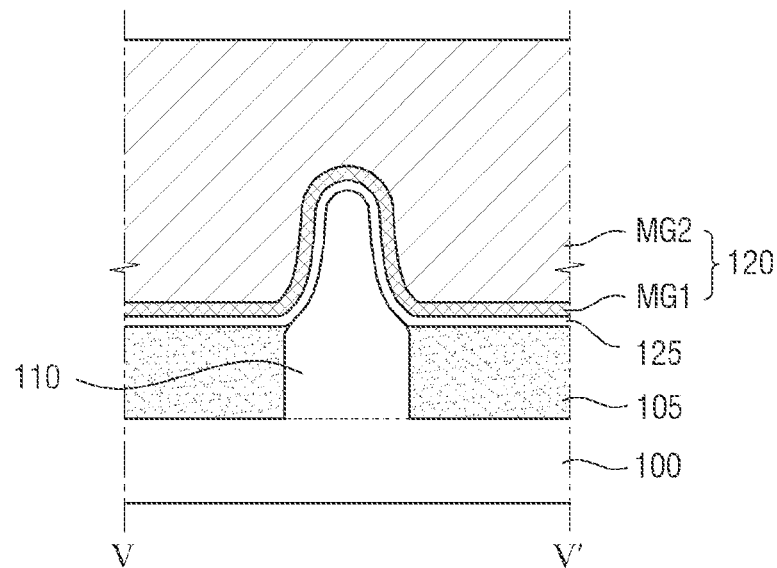
FIGS. 5A to 5D are cross-sectional views taken along line V-V' of FIG. 1.
Figure 5B:
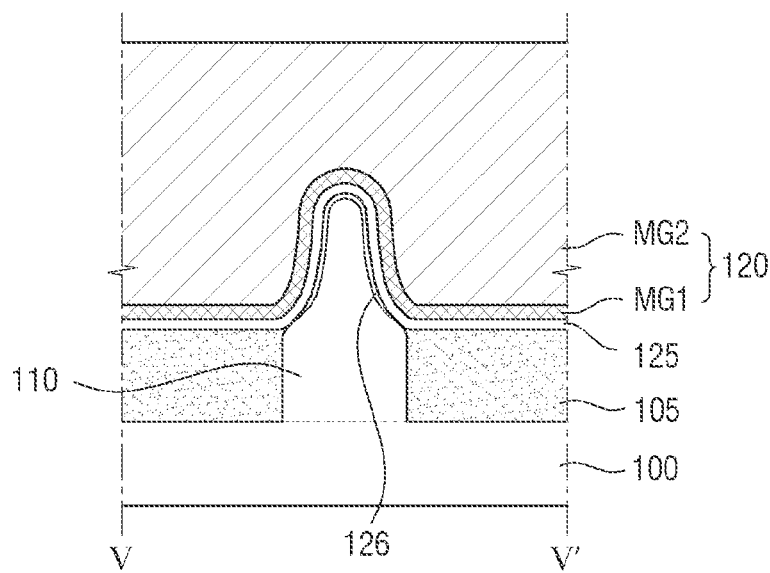
Figure 6A:
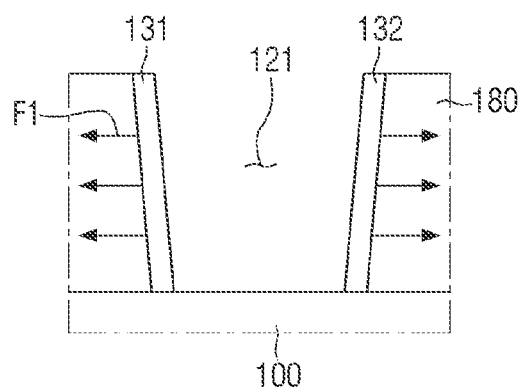
FIGS. 6A and 6B are cross-sectional views illustrating a stress-relationship between an interlayer insulating layer and a gate spacer according to doping of an element semiconductor material.
Figure 6B:
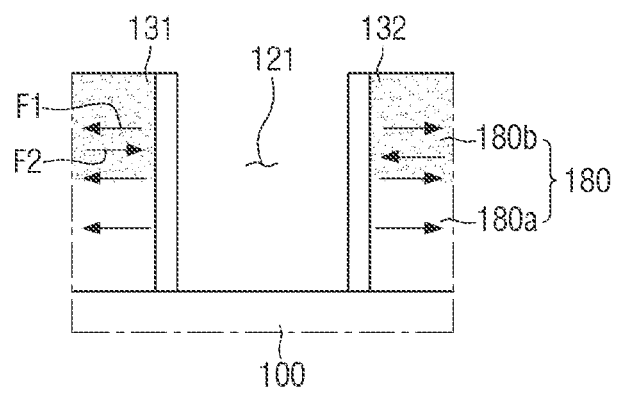

Referring to FIGS. 5A and 5B, the sidewall of the first fin-type pattern 110 as covered by the first field insulating layer 105 may be substantially perpendicular with respect to the upper surface of the substrate 100. The width of the first fin-type pattern 110 covered by the first field insulating layer 105 may be constant, as the distance from the upper surface of the substrate 100 increases.

Figure 5C:
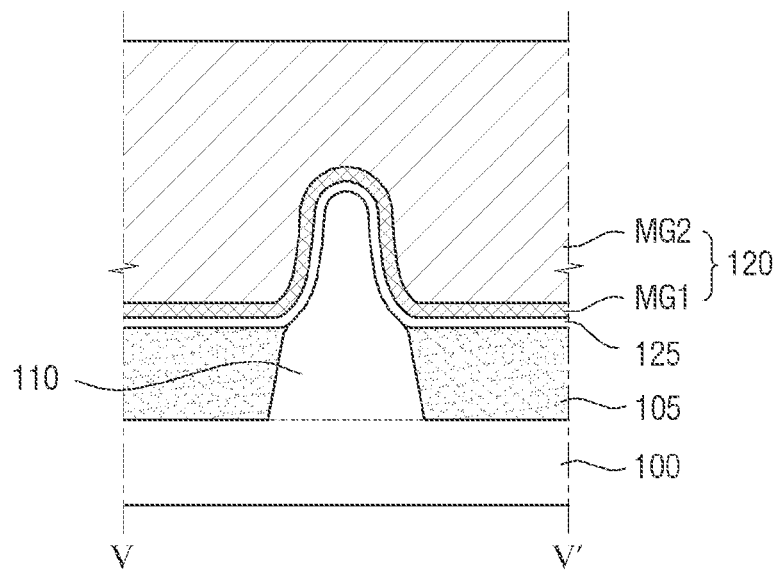
Figure 5D:
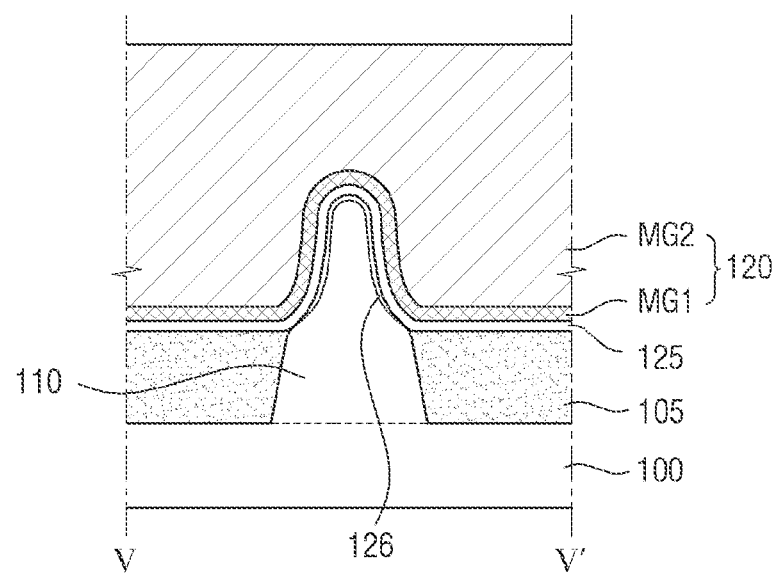

Further, referring to FIGS. 5C and 5D, the sidewall of the first fin-type pattern 110 covered by the first field insulating layer 105 may have a slope at an acute angle with respect to the upper surface of the substrate 100. The width of the first fin-type pattern 110 covered by the first field insulating layer 105 may decrease with increasing distance from the upper surface of the substrate 100.

The leakage current to the lower portion of the first fin-type pattern 110 may decrease, when the width of the first fin-type pattern 110 covered by the first field insulating layer 105 decreases with increasing distance from the upper surface of the substrate 100.

The first field insulating layer 105 may include, for example, one of oxide layer, nitride layer, oxynitride layer, or a combination thereof.

The first gate electrode 120 may extend in the second direction Y1. The first gate electrode 120 may be formed to intersect the first fin-type pattern 110.

The first gate electrode 120 may be formed on the first fin-type pattern 110 and the first field insulating layer 105. The first gate electrode 120 may surround the first fin-type pattern 110 protruding upward higher than the upper surface of the first field insulating layer 105.

The first gate electrode 120 may include a first sidewall 120a and a second sidewall 120c, which is opposed to the first sidewall 120a. The first gate electrode 120 may include a bottom surface 120b which connects the first sidewall 120a of the first gate electrode with the second sidewall 120c of the first gate electrode, and extends along the upper surface of the first fin-type pattern 110.

The second gate electrode 220 may extend in the second direction Y1. The second gate electrode 220 may be formed on the first fin-type pattern 110 so as to intersect the first fin-type pattern 110.

The second gate electrode 220 may be formed adjacent to the first gate electrode 120. No other gate electrode intersecting the first fin-type pattern 110 may be formed between the second gate electrode 220 and the first gate electrode 120.

The second gate electrode 220 may include a first sidewall 220a and a second sidewall 220c, which is opposed to the first sidewall 220a. The second gate electrode 220 may include a bottom surface 220b which connects the first sidewall 220a of the second gate electrode with the second sidewall 220c of the second gate electrode, and extends along the upper surface of the first fin-type pattern 110.

The first gate electrode 120 may include metal layers MG1, MG2. For example, the first gate electrode 120 may include a stack of two or more metal layers. The first metal layer MG1 may adjust a work function, and the second metal layer MG2 may fill a space defined by the first metal layer MG1.

For example, the first metal layer MG1 may include at least one of, for example, TiN, WN, Ru, TiAl, TiAlN, TiAlC—N TaN, TiAlC, TiC, TaC, TaCN, TaSiN, or a combination thereof, or include oxide thereof, but not limited thereto. Further, the second metal layer MG2 may include at least one of, for example, W, Al, Cu, Co, Ti, Ta, Ni, Pt, Ni—Pt, poly-Si, SiGe or a metal alloy, but not limited thereto.

The second gate electrode 220 may include metal layers MG3, MG4. For example, the second gate electrode 220 may include a stack of two or more metal layers. The third metal layer MG3 may adjust a work function, and the fourth metal layer MG4 may fill a space defined by the third metal layer MG3. Description of the second gate electrode 220 may be the same as or similar to that of the first gate electrode 120.

The first gate electrode 120 and the second gate electrode each 220 may be formed by replacement process (also known as gate last process), but not limited thereto.

The first gate spacers 131, 132 may be disposed on the substrate 100. The first gate spacers 131, 132 may be disposed on sidewalls of the first gate electrode 120.

The first gate spacers 131, 132 may include a first one-side spacer 131 disposed on the first sidewall 120a of the first gate electrode, and a first other-side spacer 132 disposed on the second sidewall 120c of the first gate electrode.

The first one-side spacer 131 and the first other-side spacer 132 may define a first trench 121. The first sidewall 121a of the first trench may be defined by the first one-side spacer 131, and the second sidewall 121c of the first trench may be defined by the first other-side spacer 132. The bottom surface 121b of the first trench may be defined by connecting the first sidewall 121a of the first trench with the second sidewall 121c of the first trench.

The second gate spacers 231, 232 may be disposed on the substrate 100. The second gate spacers 231, 232 may be disposed on sidewalls of the second gate electrode 220.

The second gate spacers 231, 232 may include a second one-side spacer 231 disposed on the first sidewall 220a of the second gate electrode, and a second other-side spacer 232 disposed on the second sidewall 220c of the second gate electrode.

The second one-side spacer 231 and the second other-side spacer 232 may define a second trench 221.

The first gate electrode 120 may be formed by filling the first trench 121 defined by the first gate spacers 131, 132. The second gate electrode 220 may be formed by filling the second trench 221 defined by the second gate spacers 231, 232.

The first gate spacers 131, 132 and the second gate spacers 231, 232 may each include at least one of, for example, silicon nitride (SiN), silicon oxynitride (SiON), silicon oxide (SiO$_2$), silicon oxycarbonitride (SiOCN), or a combination thereof.

A first gate insulating layer 125 may be formed between the first fin-type pattern 110 and the first gate electrode 120. The first gate insulating layer 125 may be formed along the profile of the first fin-type pattern 110 protruding upward higher than the first field insulating layer 105.

The first gate insulating layer 125 may be disposed between the first gate electrode 120 and the first field insulating layer 105. The first gate insulating layer 125 may be formed along the sidewalls and the bottom surface of the first trench 121. The first gate insulating layer 125 may be formed between the first gate spacers 131, 132 and the first gate electrode 120.

As illustrated in FIGS. 5B and 5D, an interfacial layer 126 may be further formed between the first gate insulating layer 125 and the first fin-type pattern 110.

As illustrated in FIGS. 5B and 5D, the interfacial layer 126 may be formed along the profile of the first fin-type pattern 110 that protrudes further than the upper surface of the first field insulating layer 105. However, example embodiments are not limited thereto.

Although not shown, according to some example embodiments, the interfacial layer 126 may be formed to extend along the upper surface of the first field insulating layer 105.

Hereinbelow, example embodiments are explained by referring to drawings in which the interfacial layer 126 is not shown for convenience of explanation.

A second gate insulating layer 225 may be formed between the first fin-type pattern 110 and the second gate electrode 220. The second gate insulating layer 225 may be formed along the sidewalls and the bottom surface of the second trench 221. The second gate insulating layer 225 may be formed between the second gate spacers 231, 232 and the second gate electrode 220. Description of the second gate insulating layer 225 may be the same as or similar to that of the first gate insulating layer 125.

The first gate insulating layer 125 and the second gate insulating layer 225 may include a high-k dielectric material having a higher dielectric constant than a silicon oxide layer. For example, the first gate insulating layer 125 and the second gate insulating layer 225 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

According to some example embodiments, the first gate insulating layer 125 and the second gate insulating layer 225 may include one or more of the nitride (e.g., hafnium nitride) or the oxynitride (e.g., hafnium oxynitride) of the metal materials described above. However, example embodiments are not limited thereto.

A first source/drain region 140 may be formed adjacent to the first gate electrode 120 and the second gate electrode 220.

The first source/drain regions 140 may be impurity regions formed within the first fin-type pattern 110, but example embodiments are not limited thereto. According to some example embodiments, the first source/drain regions 140 may include an epitaxial layer formed on the first fin-type pattern 110 or formed within the first fin-type pattern 110.

The first source/drain regions 140 may be elevated source/drain regions including an upper surface which is protruded upward higher than the upper surface of the first fin-type pattern 110.

A first interlayer insulating layer 180 may be formed on the substrate 100. The first interlayer insulating layer 180 may cover the first fin-type pattern 110, the first source/drain region 140, and the first field insulating layer 105.

The first interlayer insulating layer 180 may surround the sidewalls of the first gate electrode 120 and the second gate electrode 220. For example, the first interlayer insulating layer 180 may surround the outer sidewalls of the first gate spacers 131, 132 and the outer sidewalls of the second gate spacers 231, 232.

As illustrated in FIG. 2, the upper surface of the first interlayer insulating layer 180 may be positioned in the same plane as the upper surface of the first gate electrode 120 and the upper surface of the second gate electrode 220, but example embodiments are not limited thereto.

For example, in order to construct a self aligned contact (SAC) structure, capping patterns may be formed on the upper surfaces of the first gate electrode 120 and the second gate electrode 220, respectively, in which case the upper surface of the first gate electrode 120 and the upper surface of the second gate electrode 220 may be lower than the upper surface of the first interlayer insulating layer 180.

For example, the first interlayer insulating layer 180 may include flowable oxide (FOX), Tonen silazen (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

At least a portion of the first interlayer insulating layer 180 may include an element semiconductor material. For example, as illustrated in FIG. 2, a portion of the first interlayer insulating layer 180 may include the element semiconductor material, and the rest of the first interlayer insulating layer 180 may not include the element semiconductor material. The element semiconductor material included in the first interlayer insulating layer 180 may include at least one of silicon (Si), or germanium (Ge).

According to the example embodiment as illustrated in FIG. 2, the first interlayer insulating layer 180 may include an upper portion 180b including an element semiconductor material, and a lower portion 180a not including an element semiconductor material.

For example, the upper portion 180b of the first interlayer insulating layer 180 may be implanted or doped with the element semiconductor material, and the lower portion 180a of the first interlayer insulating layer 180 may not be implanted or doped with the element semiconductor material. Although not described above, considering a manner of fabrication, the first gate spacers 131, 132 and the second gate spacers 231, 232 may include the same material as the element semiconductor material included in the first interlayer insulating layer 180.

Referring to a concentration profile of the element semiconductor material of FIG. 4, the first interlayer insulating layer 180 may include a portion in which a concentration of the element semiconductor material increases with increasing distance from the substrate 100. For example, the upper portion 180b of the first interlayer insulating layer may correspond to such portion.

According to some example embodiments, the concentration profile of the element semiconductor material included in the first interlayer insulating layer 180 may include an area which decreases with increasing distance from the upper surface of the first interlayer insulating layer 180.

As illustrated in FIG. 4, the concentration of the element semiconductor material included in the first interlayer insulating layer 180 may decrease with increasing distance from the upper surface of the first interlayer insulating layer 180. However, this is provided only for convenience of explanation, and the example embodiments are not limited thereto.

That is, the portion with the highest concentration of the element semiconductor material included in the first interlayer insulating layer 180 may not be the upper surface of the first interlayer insulating layer 180, but a location closer to the substrate 100 than to the upper surface of the first interlayer insulating layer 180.

Further, although FIG. 4 illustrates that the concentration of the element semiconductor material abruptly decreases between the upper portion 180b of the first interlayer insulating layer and the lower portion 180a of the first interlayer insulating layer, this is provided only for convenience of explanation, and the example embodiments are not limited thereto.

The boundary between the lower portion 180a of the first interlayer insulating layer and the upper portion 180b of the first interlayer insulating layer may be a portion where the concentration of the element semiconductor material is dropped below the detection limit of the measuring equipment. Accordingly, a person with ordinary skill in the art will be able to identify the boundary between the upper portion 180b of the first interlayer insulating layer and the lower portion 180a of the first interlayer insulating layer.

According to some example embodiments, the first interlayer insulating layer 180 may be a single layer. The single layer may include or may not include the element semiconductor material.

As illustrated in FIGS. 2 and 3A, the first sidewall 121a of the first trench defined by the first one-side spacer 131 may have a slope at a first angle a1 with the bottom surface 121b of the first trench. The second sidewall 121c of the first trench defined by the first other-side spacer 132 may have a slope at a second angle a2 with the bottom surface 121b of the first trench.

For example, the first angle a1 and the second angle a2 may be perpendicular with respect to the upper surface of the first fin-type pattern 110. The width of the first trench 121 may be substantially constant with increasing distance from the upper surface of the substrate 100, that is, with increasing distance from the bottom surface 121b of the first trench.

As illustrated in FIGS. 2 and 3B, the first sidewall 120a of the first gate electrode may have a slope at a third angle b1 with the bottom surface 120b of the first gate electrode. The second sidewall 120c of the first gate electrode may have a slope at a fourth angle b2 with the bottom surface 120b of the first gate electrode 120.

The first sidewall 120a of the first gate electrode opposing the sidewall of the first one-side spacer 131 and the second sidewall 120c of the first gate electrode opposing the sidewall of the first other-side spacer 132 may form the third angle b1 and the fourth angle b2 with respect to the bottom surface 120b of the first gate electrode 120. The third angle b1 and the fourth angle b2 may be right angles, like the first angle a1 and the second angle a2 illustrated in FIG. 3A.

The width of the first gate electrode 120 may be constant with increasing distance from the upper surface of the substrate 100. In other words, the width of the first gate electrode 120 may be substantially constant along a distance from the bottom surface 120b of the first gate electrode to the upper surface of the first gate electrode 120.

Although not illustrated, a point where the first sidewall 120a of the first gate electrode and the bottom surface 120b of the first gate electrode meet, and a point where the second sidewall 120c of the first gate electrode and the bottom surface 120b of the first gate electrode meet, may have round shape The second gate electrode 220 and the second trench 221 will not be redundantly described, as these may be the same as or substantially similar to the first gate electrode 120 and the first trench 121 described above.

Referring to FIGS. 6A and 6B, varying the slopes of the first gate spacers 131, 132 by implanting or doping an element semiconductor material into the first interlayer insulating layer 180 will be described.

For example, it is assumed herein that the first interlayer insulating layer 180 does not including the element semiconductor material and has a tensile stress characteristic.

The expression "tensile stress characteristic" as used herein refers to an interlayer insulating layer having a tension that pulls the gate electrode or the gate spacers toward the interlayer insulating layer. That is, the tensile stress characteristic may be the stress characteristic of the interlayer insulating layer pulling the gate spacer to a first force (F1) direction as illustrated in FIG. 6A.

Figure 29:
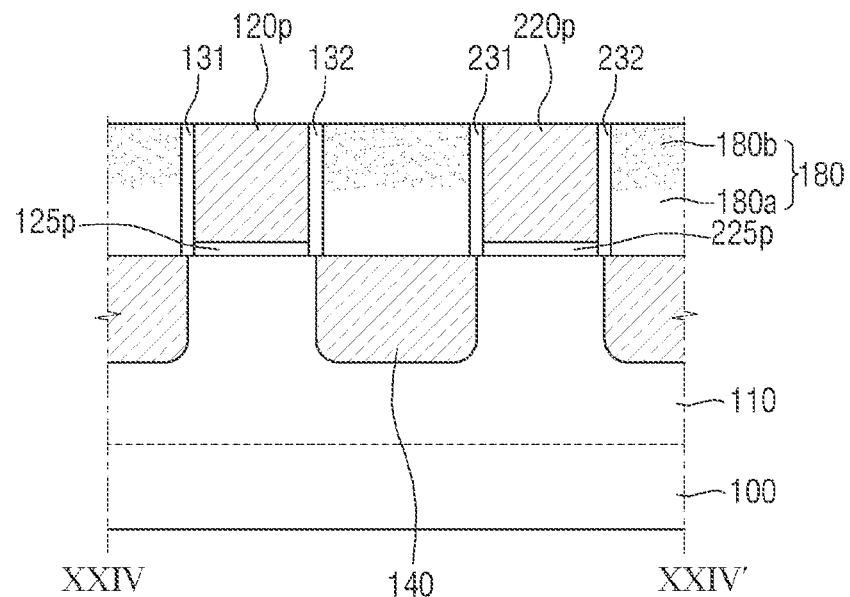
Figure 30:
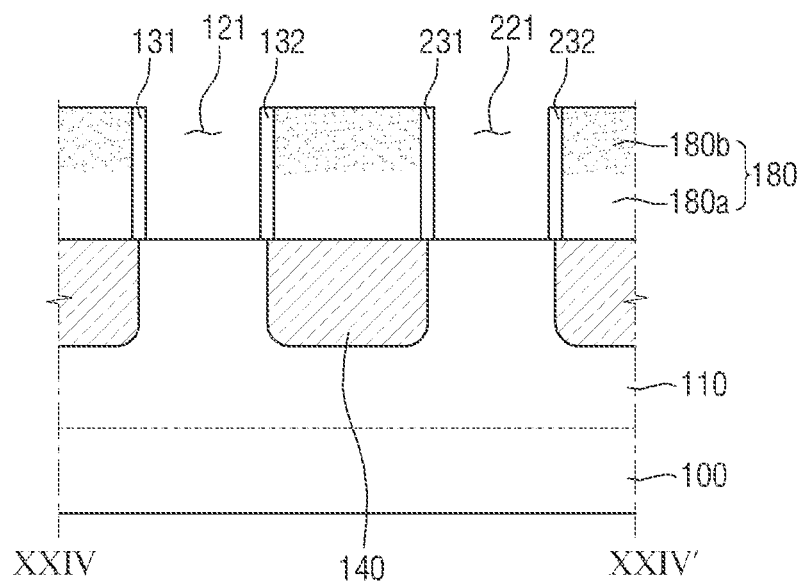

Referring to FIGS. 29 and 30 which will be described below, when the dummy gate electrodes 120p, 220p are removed, the first interlayer insulating layer 180 may pull the first gate spacers 131, 132 with the first force (F1). That is, the width between the first gate spacers 131, 132 may increase with increasing distance from the substrate 100.

However, by implanting or doping an element semiconductor material into the first interlayer insulating layer 180, the width between the first gate spacers 131, 132 may be prevented from increasing with increasing distance from the substrate 100, when the dummy gate electrode is removed.

After the element semiconductor material is implanted or doped into the first interlayer insulating layer 180, the first interlayer insulating layer 180 may be subjected to thermal treatment. During the thermal treatment of the first interlayer insulating layer 180, the element semiconductor material may be oxidized, and thus oxidized element semiconductor material may be formed.

The oxidized element semiconductor material may increase in volume than the element semiconductor material. That is, due to volume expansion of the oxidized element semiconductor material, the portion of the first interlayer insulating layer 180 including the element semiconductor material may push the first gate spacers 131, 132. That is, the oxidized element semiconductor material pushes the first gate spacers 131, 132 with a second force (F2) as illustrated in FIG. 6B.

The lower portion 180a of the first interlayer insulating layer that does not include the element semiconductor material pulls the first gate spacers 131, 132 with the first force (F1). The upper portion 180b of the first interlayer insulating layer that includes the element semiconductor material pushes the first gate spacers 131, 132 with a third force (F2−F1).

Accordingly, by adjusting the force with which the lower portion 180a of the first interlayer insulating layer, which does not include the element semiconductor material, may pull the first gate spacers 131, 132, and the force with which the upper portion 180b of the first interlayer insulating layer, which includes the element semiconductor material, may push the first gate spacers 131, 132, the slopes of the first gate spacers 131, 132 (or the slope of the sidewall of the first trench 121) may be adjusted.

In other words, the stress characteristic of the upper portion 180b of the first interlayer insulating layer may be controlled to have compressive stress characteristic, which is different from the stress characteristic of the lower portion 180a of the first interlayer insulating layer 180, as a portion of the first interlayer insulating layer, which has the tensile stress characteristic, is implanted or doped with the element semiconductor material.

By adjusting the stress characteristic of the upper portion 180b of the first interlayer insulating layer 180 and the stress characteristic of the lower portion 180a of the first interlayer insulating layer, the stress characteristic of the first interlayer insulating layer 180 including the element semiconductor material may be adjusted to exhibit either one of neutral stress characteristic, compressive stress characteristic, or tensile stress characteristic.

Figure 7:
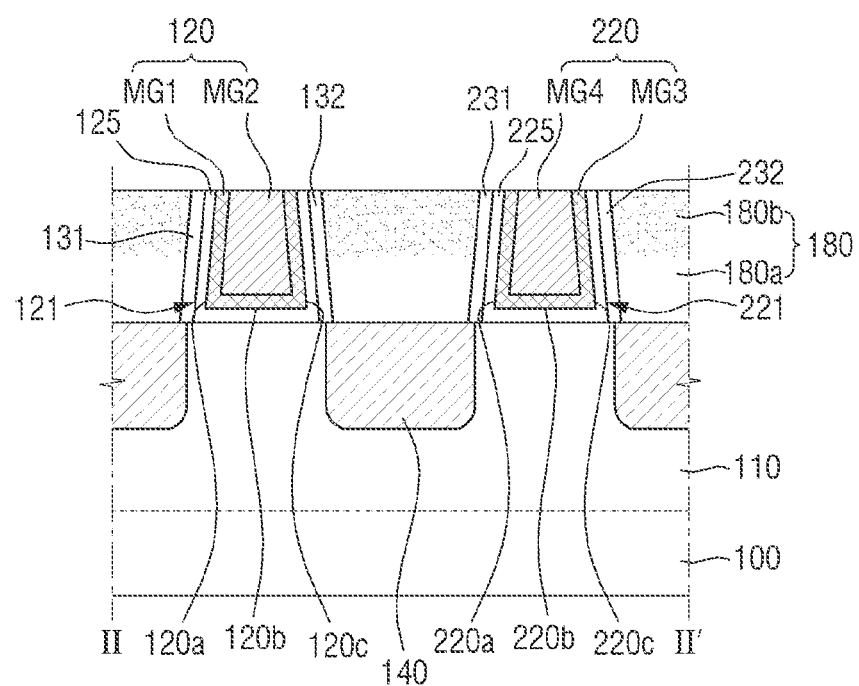
FIG. 7 is a view illustrating a semiconductor device according to an example embodiment.

FIG. 7 is a view illustrating a semiconductor device according to an example embodiment. For convenience of explanation, differences that are not explained above with reference to FIGS. 1 to 6B will be mainly explained below.

Referring to FIG. 7, in a semiconductor device according to the present example embodiments, the width of the first trench 121 and the width of the second trench 221 may decrease with increasing distance from the upper surface of the substrate 100.

The sidewall of the first trench 121 defined by the first one-side spacer 131, and the sidewall of the first trench 121 defined by the first other-side spacer 132 may have slopes at an acute angle with the bottom surface of the first trench 121, respectively.

Description of the second trench 221 may be the same as or similar to that of the first trench 121.

The first sidewall 120a of the first gate electrode and the second sidewall 120c of the first gate electrode may have slopes at an acute angle with the bottom surface 120b of the first gate electrode.

Likewise, the first sidewall 220a of the second gate electrode and the second sidewall 220c of the second gate electrode may have slopes at an acute angle with the bottom surface 220b of the second gate electrode.

Hereinbelow, it is defined that the sidewall of the trench has a negative slope when the sidewall of the trench has a slope at an acute angle with the bottom surface of the trench. Likewise, it is defined that the sidewall of the gate electrode has a negative slope when the sidewall of the gate electrode has a slope at an acute angle with the bottom surface of the gate electrode.

As illustrated in FIG. 7, the first sidewall 120a of the first gate electrode, the second sidewall 120c of the first gate electrode, the first sidewall 220a of the second gate electrode, and the second sidewall 220c of the second gate electrode may have negative slopes, respectively. That is, the sidewall of the first trench 121 and the sidewall of the second trench 221 may each have negative slope.

Figure 8:
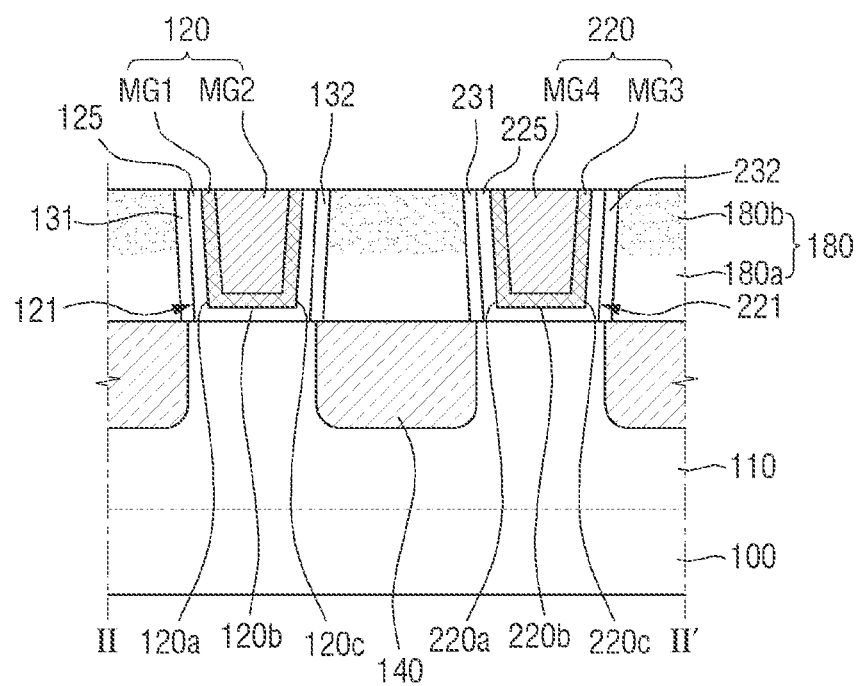
FIG. 8 is a view illustrating a semiconductor device according to an example embodiment.

FIG. 8 is a view illustrating a semiconductor device according to an example embodiment. For convenience of explanation, differences that are not explained above with reference to FIGS. 1 to 6B will be mainly explained below.

Referring to FIG. 8, in a semiconductor device according to the present example embodiments, the width of the first trench 121 and the width of the second trench 221 may increase with increasing distance from the upper surface of the substrate 100.

The sidewall of the first trench 121 defined by the first one-side spacer 131, and the sidewall of the first trench 121 defined by the first other-side spacer 132 may have slopes at an obtuse angle with the bottom surface of the first trench 121, respectively.

Description of the second trench 221 may be the same as or similar to that of the first trench 121.

The first sidewall 120a of the first gate electrode and the second sidewall 120c of the first gate electrode may have slopes at an obtuse angle with the bottom surface 120b of the first gate electrode.

Likewise, the first sidewall 220a of the second gate electrode and the second sidewall 220c of the second gate electrode may have slopes at an obtuse angle with the bottom surface 220b of the second gate electrode.

Hereinbelow, it is defined that the sidewall of the trench has a positive slope when the sidewall of the trench has a slope at an obtuse angle with the bottom surface of the trench. Likewise, it is defined that the sidewall of the gate electrode has a positive slope when the sidewall of the gate electrode has a slope at an obtuse angle with the bottom surface of the gate electrode.

As illustrated in FIG. 8, the first sidewall 120a of the first gate electrode, the second sidewall 120c of the first gate electrode, the first sidewall 220a of the second gate electrode, the second sidewall 220c of the second gate electrode, the sidewall of the first trench 121, and the sidewall of the second trench 221 may have positive slopes, respectively.

Hereinbelow, the sidewall of the first trench 121 having a negative slope, and the sidewall of the first trench 121 at a right angle are defined with different signs. Likewise, the sidewall of the first trench 121 having a positive slope, and the sidewall of the first trench 121 at a right angle are defined with different signs.

Figure 9:
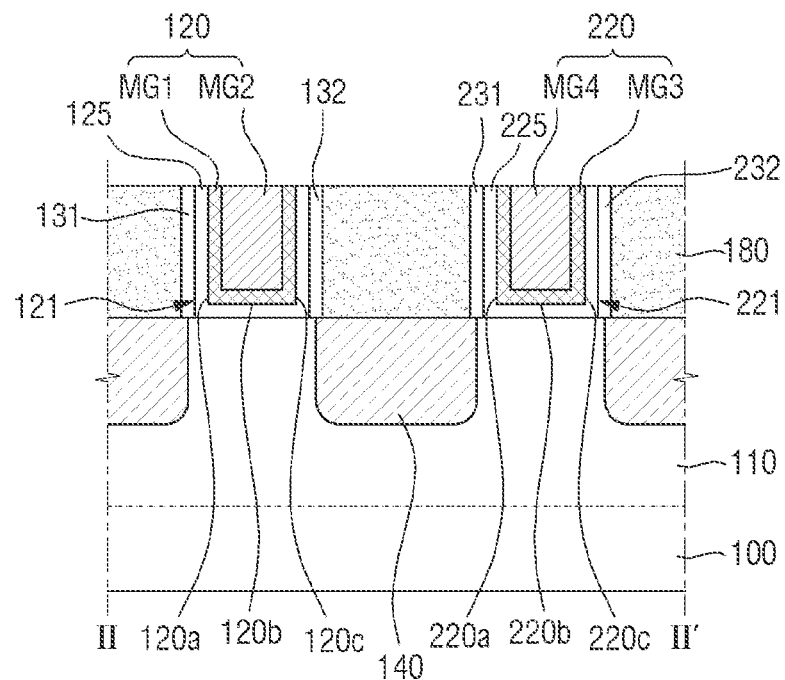
FIG. 9 is a view illustrating a semiconductor device according to an example embodiment.

FIG. 9 is a view illustrating a semiconductor device according to an example embodiment. For convenience of explanation, differences that are not explained above with reference to FIGS. 1 to 6B will be mainly explained below.

Referring to FIG. 9, in a semiconductor device according to the present example embodiments, an entire portion of the first interlayer insulating layer 180 may include an element semiconductor material.

The stress characteristic of the first interlayer insulating layer 180 may be adjusted by adjusting, for example, concentration profile and/or amount of the element semiconductor material included in the first interlayer insulating layer 180. By doing so, the slopes of the first gate spacers 131, 132, or the slopes of the sidewalls 120a, 120c of the first gate electrode may be adjusted.

Figure 10:
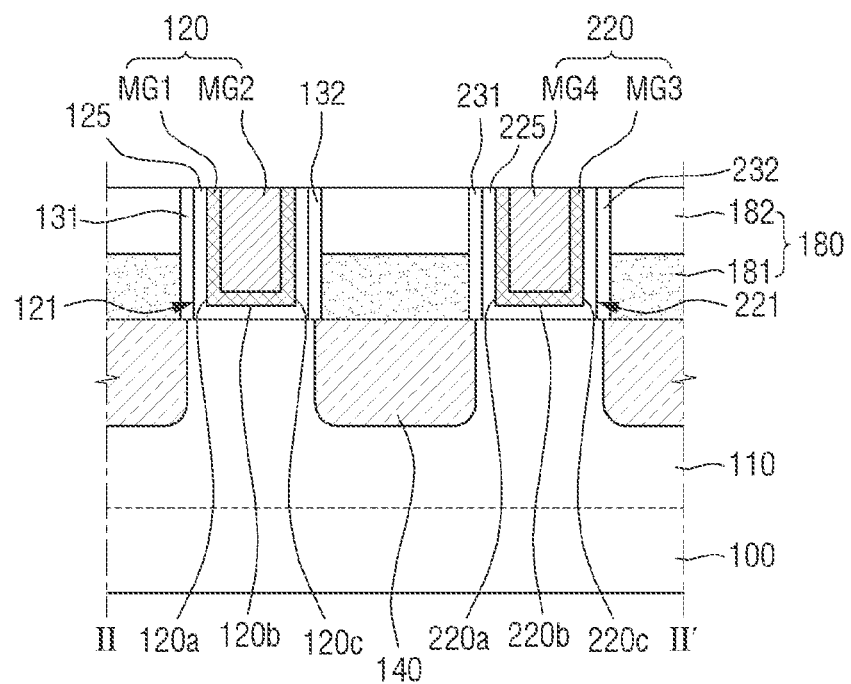
FIG. 10 is a view illustrating a semiconductor device according to an example embodiment.

FIG. 10 is a view illustrating a semiconductor device according to an example example embodiment. For convenience of explanation, differences that are not explained above with reference to FIGS. 1 to 6B will be mainly explained below.

Referring to FIG. 10, in a semiconductor device according to an example embodiment, the first interlayer insulating layer 180 may include a first lower interlayer insulating layer 181, and a first upper interlayer insulating layer 182.

The first upper interlayer insulating layer 182 may be formed on the first lower interlayer insulating layer 181. That is, on the substrate 100, the first lower interlayer insulating layer 181 and the first upper interlayer insulating layer 182 may be stacked in a sequential order.

The upper surface of the first upper interlayer insulating layer 182 may be in the same plane as the upper surface of the first gate electrode 120 and the upper surface of the second gate electrode 220.

The first lower interlayer insulating layer 181 may include an element semiconductor material with the concentration profile as the upper portion 180b of the first interlayer insulating layer 180 illustrated in FIG. 4. The first upper interlayer insulating layer 182 may not include an element semiconductor material.

The first lower interlayer insulating layer 181 may include the same material as the first upper interlayer insulating layer 182, or these may include different materials from each other.

Figure 11:
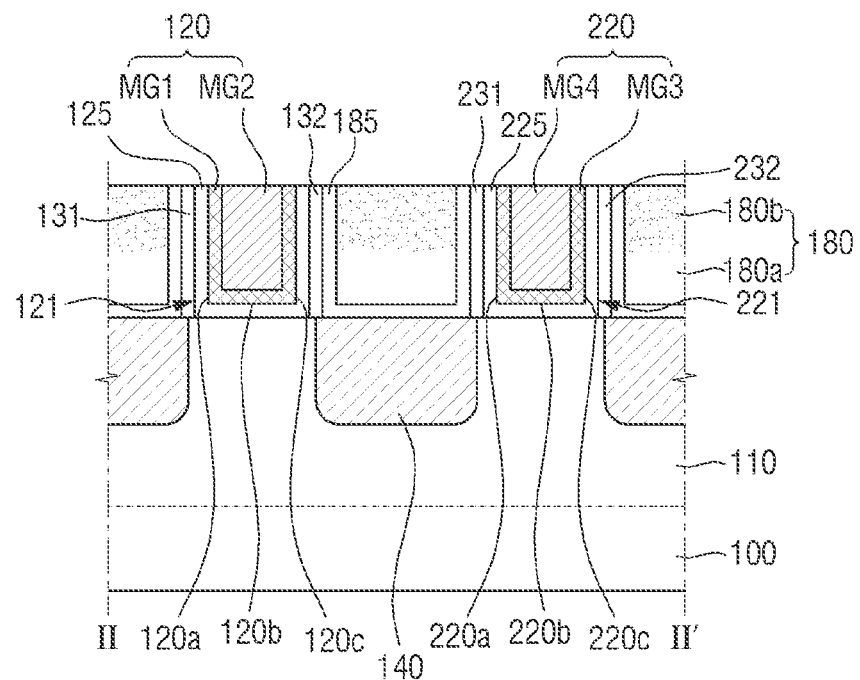
FIG. 11 is a view illustrating a semiconductor device according to an example embodiment.

FIG. 11 is a view illustrating a semiconductor device according to an example embodiment. For convenience of explanation, differences that are not explained above with reference to FIGS. 1 to 6B will be mainly explained below.

Referring to FIG. 11, the semiconductor device according to the present example embodiments may further include an etch-stop layer 185 between the first interlayer insulating layer 180 and the first source/drain region 140.

The etch-stop layer 185 may extend along the sidewalls of the first gate spacers 131, 132, the second gate spacers 231, 232, and the upper surface of the first source/drain region 140.

The etch-stop layer 185 may extend between the first interlayer insulating layer 180 and the first gate spacers 131, 132, and between the first interlayer insulating layer 180 and the second gate spacers 231, 232.

A portion of the etch-stop layer 185 extending along the sidewalls of the first gate spacers 131, 132 and the sidewalls of the second gate spacers 231, 232 may extend up to the height of the upper surface of the upper portion 180b of the first interlayer insulating layer 180.

For example, the etch-stop layer 185 may include at least one of silicon nitride (SiN), silicon oxynitride (SiON), silicon oxide ($SiO_2$), silicon oxycarbonitride (SiOCN), silicon carbonitride (SiCN), or a combination thereof, but example embodiments are not limited thereto.

Figure 12:
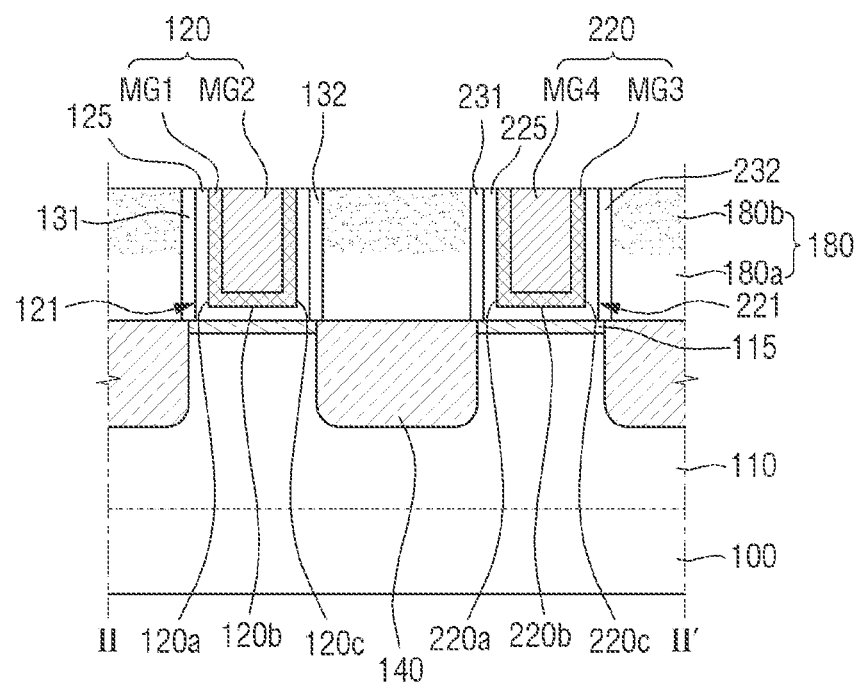
FIG. 12 is a view illustrating a semiconductor device according to an example embodiment.

FIG. 12 is a view illustrating a semiconductor device according to the present example embodiments. For convenience of explanation, differences that are not explained above with reference to FIGS. 1 to 6B will be mainly explained below.

Referring to FIG. 12, a semiconductor device according to some example embodiments may further include a channel layer 115 formed between the first fin-type pattern 110 and the first gate electrode 120, and between the first fin-type pattern 110 and the second gate electrode 220.

The channel layer 115 may be formed between the first fin-type pattern 110 and the first gate insulating layer 125, and between the first fin-type pattern 110 and the second gate insulating layer 225.

For example, the channel layer 115 may be formed on the upper surface of the first fin-type pattern 110.

The channel layer 115 may include a material which is different from the material that forms the first fin-type pattern 110. For example, in the case where the first fin-type pattern 110 is a silicon fin-type pattern, the channel layer 115 may include silicon germanium which has a greater lattice constant than silicon.

According to some example embodiments, in the case where the first fin-type pattern 110 is a silicon germanium fin-type pattern, the channel layer 115 may include, for example, silicon germanium or germanium, which has a greater lattice constant than the silicon germanium included in the first fin-type pattern 110. According to some other example embodiments, the channel layer 115 may include silicon having a smaller lattice constant than the silicon germanium.

Figure 13:
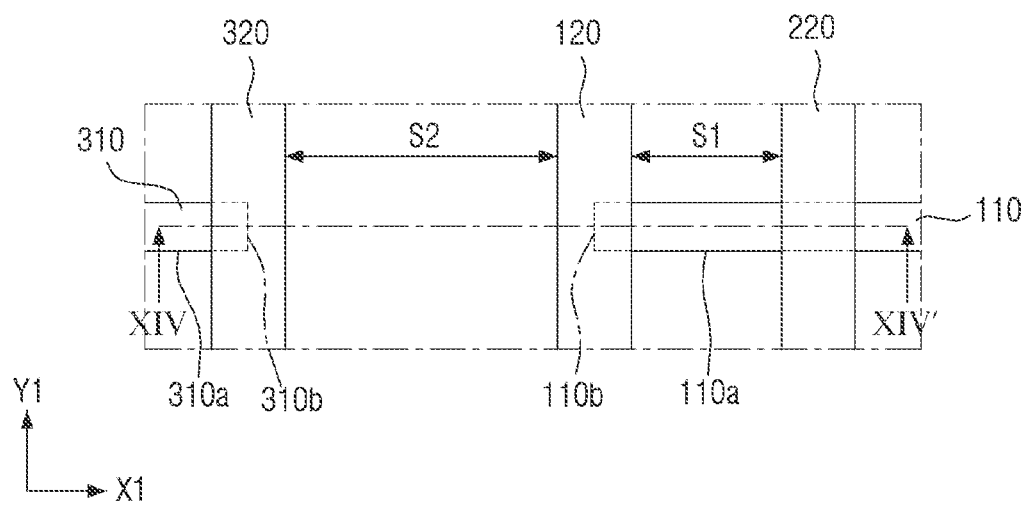
FIG. 13 is a top view illustrating a semiconductor device according to an example embodiment.
Figure 14:
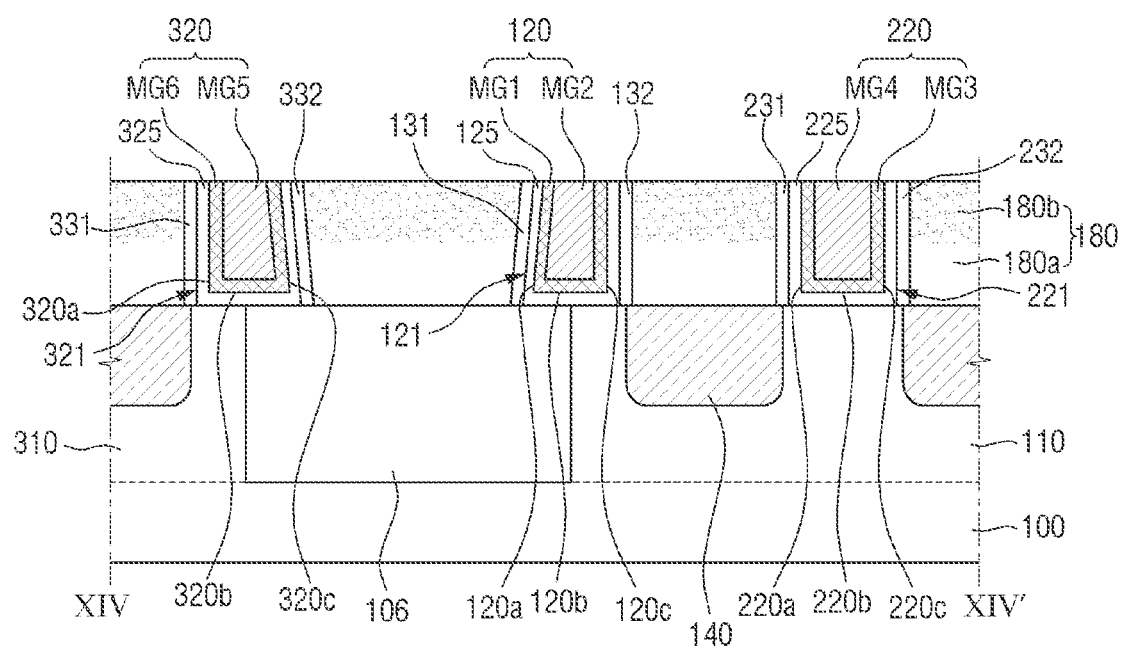
FIG. 14 is a cross-sectional view taken along line XIV-XIV' of FIG. 13.

FIG. 13 is a top view illustrating a semiconductor device according to an example embodiment. FIG. 14 is a cross-sectional view taken along line XIV-XIV' of FIG. 13. For convenience of explanation, differences that are not explained above with reference to FIGS. 1 to 6B will be mainly explained below.

Referring to FIGS. 13 and 14, a semiconductor device according to the present example embodiment may further include a second fin-type pattern 310, a third gate electrode 320, and third gate spacers 331, 332.

The second fin-type pattern 310 may protrude from the substrate 100. The second fin-type pattern 310 may extend longitudinally in a first direction X1.

The first fin-type pattern 110 and the second fin-type pattern 310 may be aligned in the first direction X1. The short side 110b of the first fin-type pattern 110 and the short side 310b of the second fin-type pattern 310 may be provided to oppose to each other in the first direction X1.

A second field insulating layer 106 may be formed between the first fin-type pattern 110 and the second fin-type pattern 310. The upper surface of the second field insulating layer 106 disposed between the short side 110b of the first fin-type pattern 110 and the short side 310b of the second fin-type pattern 310 may be positioned in the same plane as the upper surface of the first fin-type pattern 110 and the upper surface of the second fin-type pattern 310, or may be higher.

The upper surface of the second field insulating layer 106 disposed between the short side 110b of the first fin-type pattern 110 and the short side 310b of the second fin-type pattern 310 may be higher than the upper surface of the first field insulating layer 105 (FIG. 5A) disposed at the long side 110a of the first fin-type pattern 110.

FIG. 14 illustrates the upper surface of the second field insulating layer 106 being a flat surface, but this is only for convenience of explanation and example embodiments are not limited thereto. At least a portion of the upper surface of the second field insulating layer 106 between the first gate electrode 120 and the third gate electrode 320 may be recessed from the upper surface of the second field insulating layer 106 that overlaps with, for example, the first gate electrode 120.

The first gate electrode 120 may be formed on the first fin-type pattern 110 and the second field insulating layer 106. A portion of the first gate electrode 120 may intersect the first fin-type pattern 110, and the rest of the first gate electrode 120 may be formed on the second field insulating layer 106. That is, the first gate electrode 120 may be formed on an end portion of the first fin-type pattern 110.

The third gate electrode 320 may be formed on the second fin-type pattern 310 and the second field insulating layer 106. A portion of the third gate electrode 320 may intersect the second fin-type pattern 310, and the rest of the third gate electrode 320 may be formed on the second field insulating layer 106. That is, the third gate electrode 320 may be formed on an end portion of the second fin-type pattern 310.

The third gate electrode 320 may include a first sidewall 320a and a second sidewall 320c, which opposes the first sidewall 320a. The third gate electrode 320 may include a bottom surface 320b which connects the first sidewall 320a of the third gate electrode with the second sidewall 320c of the third gate electrode, and extends along the upper surface of the second fin-type pattern 310 and the upper surface of the second field insulating layer 106.

The third gate electrode 320 may include metal layers MG5, MG6. For example, the third gate electrode 320 may include a stack of two or more metal layers.

No additional gate electrode may be formed between the first gate electrode 120 and the second gate electrode 220, and between the first gate electrode 120 and the third gate electrode 320. That is, the second gate electrode 220 and the third gate electrode 320 may be the gate electrodes that are most adjacent to the first gate electrode 120.

The distance S1 between the first gate electrode 120 and the second gate electrode 220 may be different from the distance S2 between the first gate electrode 120 and the third gate electrode 320. For example, the distance S1 between the first gate electrode 120 and the second gate electrode 220 may be smaller than the distance S2 between the first gate electrode 120 and the third gate electrode 320.

The third gate spacers 331, 332 may be formed on the substrate 100. The third gate spacers 331, 332 may be disposed on the sidewalls of the third gate electrode 320, respectively.

The third gate spacers 331, 332 may include a third one-side spacer 331 disposed on the first sidewall 320a of the third gate electrode and a third other-side spacer 332 disposed on the second sidewall 320c of the third gate electrode.

The third one-side spacer 331 and the third other-side spacer 332 may define a third trench 321. The third gate electrode 320 may be formed by filling the third trench 321 defined by the third gate spacers 331, 332.

The third gate insulating layer 325 may be formed along the sidewall and the bottom surface of the third trench 321. The third gate electrode 320 may be formed on the third gate insulating layer 325.

The first interlayer insulating layer 180 may surround the outer sidewalls of the third gate electrode 331, 332. The upper surface of the first interlayer insulating layer 180 may be in the same plane as the upper surface of the third gate electrode 320.

As illustrated in FIG. 14, the first sidewall 220a of the second gate electrode and the second sidewall 220c of the second gate electrode may have slopes at a right angle with the bottom surface 220b of the second gate electrode.

Further, the second sidewall 120c of the first gate electrode, which is closer to the second gate electrode 220 than the first sidewall 120a of the first gate electrode, may also have a slope at a right angle with the bottom surface 120b of the first gate electrode.

However, the first sidewall 120a of the first gate electrode may have a slope at an acute angle with the bottom surface 120b of the first gate electrode.

Due to difference in the distance S1 between the first gate electrode 120 and the second gate electrode 220 and the distance S2 between the first gate electrode 120 and the third gate electrode 320, the slope of the first sidewall 120a of the first gate electrode and the slope of the second sidewall 120c of the first gate electrode may be different from each other.

That is, because the volume of the upper portion 180b of the first interlayer insulating layer formed closer to the first one-side spacer 131 is different from the volume of the upper portion 180b of the first interlayer insulating layer formed closer to the first other-side spacer 132, the slope of the first sidewall 120a of the first gate electrode and the slope of the second sidewall 120c of the first gate electrode may be different.

As the upper portion 180b of the first interlayer insulating layer including the element semiconductor material has a greater volume, the force with which the upper portion 180b of the first interlayer insulating layer pushes the first interlayer insulating layers 131, 132 may become greater.

Accordingly, as the first one-side spacer 131 and the first other-side spacer 132 are under different stresses, the sign of the slope of the sidewall of the first trench 121 may vary.

As illustrated in FIG. 14, the second sidewall 320c of the third gate electrode adjacent to the first gate electrode 120 may have a slope at an acute angle with the bottom surface 320b of the third gate electrode. The first sidewall 320a of the third gate electrode may have a slope at a right angle with the bottom surface 320b of the third gate electrode. However, example embodiments are not limited thereto.

The slope of the first sidewall 320a of the third gate electrode and the slope of the second sidewall 320c of the third gate electrode with the bottom surface 320b of the third gate electrode may vary according to a distance between a gate electrode adjacent to the third one-side spacer 331 and the third gate electrode 320.

Although the second field insulating layer 106 is illustrated to be formed between the first fin-type pattern 110 and the second fin-type pattern 310, example embodiments are not limited thereto. The first fin-type pattern 110 and the second fin-type pattern 310 may be one integrated fin-type pattern.

Figure 15:
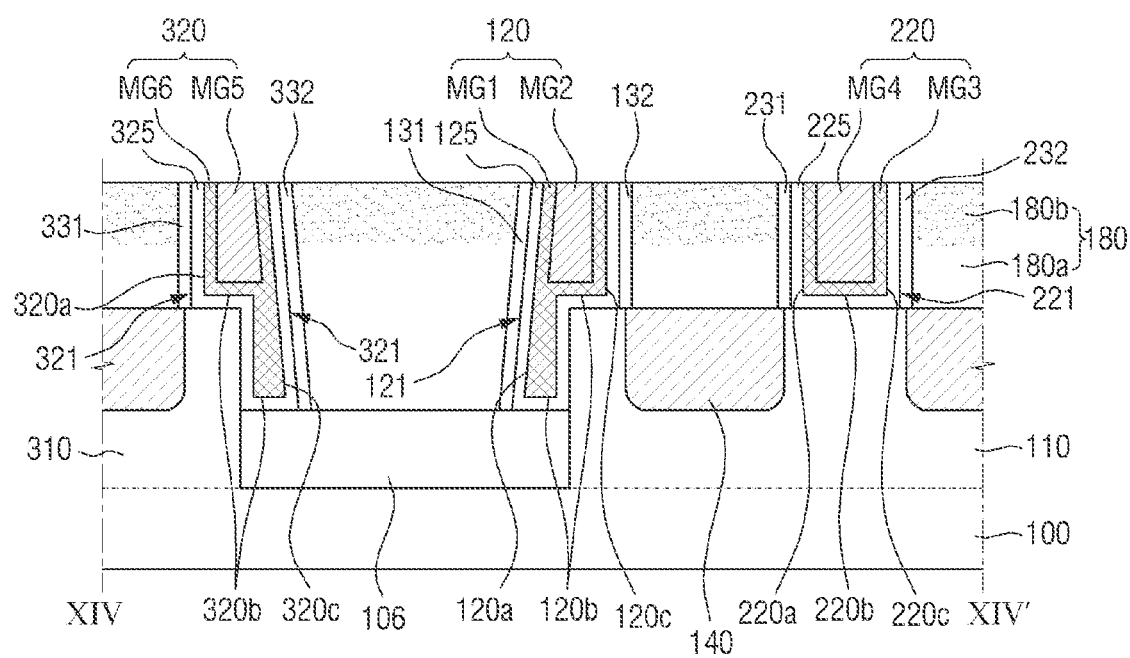
FIG. 15 is a view illustrating a semiconductor device according to an example embodiment.

FIG. 15 is a view illustrating a semiconductor device according to some example embodiments. For convenience of explanation, differences that are not explained above with reference to FIGS. 13 and 14 will be mainly explained below.

Referring to FIG. 15, in a semiconductor device according to the present example embodiments, the upper surface of the second field insulating layer 106 may be lower than the upper surface of the first fin-type pattern 110 and the upper surface of the second fin-type pattern 310.

Accordingly, the first gate electrode 120 may be formed to surround an end of the first fin-type pattern 110 which protrudes upward higher than the second field insulating layer 106, and the third gate electrode 320 may be formed to surround an end of the second fin-type pattern 310 which protrudes upward higher than the second field insulating layer 106.

According to some example embodiments, the second field insulating layer 106 may include a protruding portion at a contact portion with the short side 110b of the first fin-type pattern 110 or the short side 310b of the second fin-type pattern 310. The upper surface of the protruding portion may be on the same plane as the upper surface of the first fin-type pattern 110 and the upper surface of the second fin-type pattern 310, or it may be higher.

Unlike the illustration in FIGS. 14 and 15, the first sidewall 120a of the first gate electrode may have a slope at a right angle with the bottom surface 120b of the first gate electrode, and the second sidewall 120c of the first gate electrode may have a slope at an obtuse angle with the bottom surface 120b of the first gate electrode.

This is because the stress-relationship between the upper portion 180b of the first interlayer insulating layer and the lower portion 180a of the first interlayer insulating layer may be adjusted according to the amount and/or concentration profile of the element semiconductor material included in the upper portion 180b of the first interlayer insulating layer.

Figure 17A:
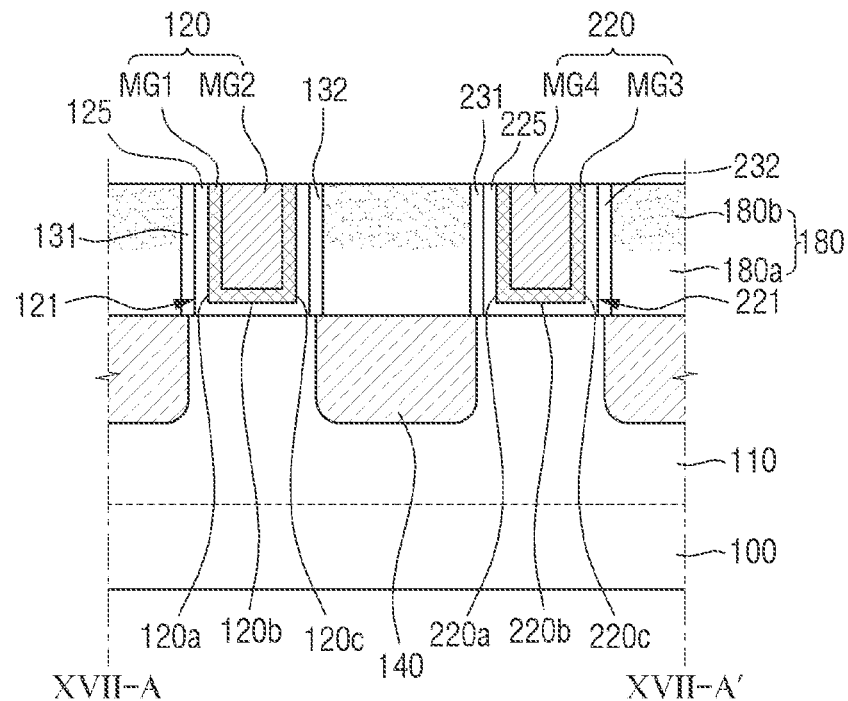
FIGS. 17A and 17B are cross-sectional views taken along lines XVII-A-XVII-A' and XVII-D-XVII-D' of FIG. 16, according to an example embodiment.
Figure 17B:
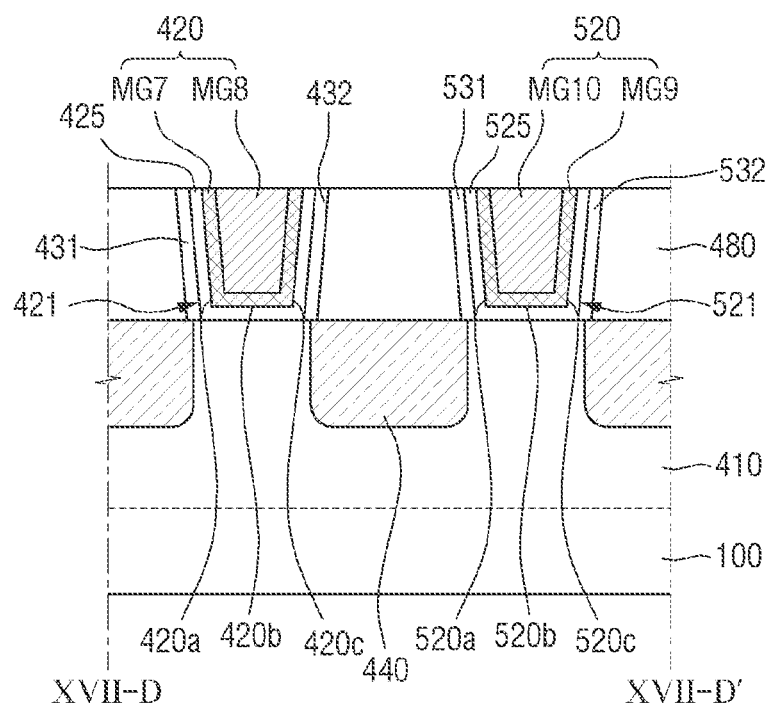

FIG. 16 is a top view illustrating a semiconductor device according to some example embodiments. FIGS. 17A and 17B are cross-sectional views taken along lines XVII-A-XVII-A' and XVII-D-XVII-D' of FIG. 16, respectively, according to an example embodiment.

Referring to FIG. 17A, the cross-sectional view taken along line XVII-A-XVII-A' of FIG. 16 is illustrated in the same or similar manner as the view of FIG. 2 for convenience of explanation only. Accordingly, example embodiments are not limited to such illustration. Further, for convenience of explanation, elements or operations overlapping with those already described above with reference to FIGS. 1 to 12 will not be described or described as briefly as possible for the sake of brevity.

Referring to FIGS. 16, 17A, and 17B, the semiconductor device according to the present example embodiments may include a first fin-type pattern 110, a first gate electrode 120, a second gate electrode 220, first gate spacers 131, 132, second gate spacers 231, 232, a third fin-type pattern 410, a fourth gate electrode 420, a fifth gate electrode 520, fourth gate spacers 431, 432, fifth gate spacers 531, 532, a first interlayer insulating layer 180, and a second interlayer insulating layer 480.

The substrate 100 may include a first region I and a second region II. The first region I and the second region II may be spaced apart from each other, or connected with each other.

In the first region I, the first fin-type pattern 110, the first gate electrode 120, the second gate electrode 220, the first gate spacers 131, 132, and the second gate spacers 231, 232 may be formed.

In the first region I, a sixth gate electrode 170 intersecting the first fin-type pattern 110 may be further formed. The first gate electrode 120 may be disposed between the second gate electrode 220 and the sixth gate electrode 170.

The distance S1 between the first gate electrode 120 and the second gate electrode 220 may be the same as the distance between the first gate electrode 120 and the sixth gate electrode 170. No other gate electrode intersecting the first fin-type pattern 110 may be formed between the sixth gate electrode 170 and the first gate electrode 120.

In the second region II, the third fin-type pattern 410, the fourth gate electrode 420, the fifth gate electrode 520, the fourth gate spacers 431, 432 and the fifth gate spacers 531, 532 may be formed.

The third fin-type pattern 410 may protrude from the substrate 100. The third fin-type pattern 410 may extend longitudinally in a third direction X2.

The fourth gate electrode 420 may extend in a fourth direction Y2. The fourth gate electrode 420 may be formed on the third fin-type pattern 410 so as to intersect the third fin-type pattern 410.

The fourth gate electrode 420 may include a first sidewall 420a and a second sidewall 420c, which opposes the first sidewall 420a. The fourth gate electrode 420 may include a bottom surface 420b which connects the first sidewall 420a of the fourth gate electrode with the second sidewall 420c of the fourth gate electrode, and extends along the upper surface of the third fin-type pattern 410.

The fifth gate electrode 520 may extend in the fourth direction Y2. The fifth gate electrode 520 may be formed on the third fin-type pattern 410 while intersecting the third fin-type pattern 410.

No other gate electrode intersecting the third fin-type pattern 410 may be formed between the fifth gate electrode 520 and the fourth gate electrode 420.

The fifth gate electrode 520 may include a first sidewall 520a and a second sidewall 520c, which opposes the first sidewall 520a. The fifth gate electrode 520 may include a bottom surface 520b which connects the first sidewall 520a of the fifth gate electrode with the second sidewall 520c of the fifth gate electrode, and extends along the upper surface of the third fin-type pattern 410.

The fourth gate electrode 420 may include metal layers MG7, MG8, and the fifth gate electrode 520 may include metal layers MG9, MG10. According to some example embodiments, the fourth gate electrode 420 and the fifth gate electrode 520 may be stacks of two or more metal layers.

In the second region II, a seventh gate electrode 470 intersecting the third fin-type pattern 410 may be additionally formed. The fourth gate electrode 420 may be disposed between the fifth gate electrode 520 and the seventh gate electrode 470.

The distance S3 between the fourth gate electrode 420 and the fifth gate electrode 520 may be the same as the distance between the fourth gate electrode 420 and the seventh gate electrode 470. No other gate electrode intersecting the third fin-type pattern 410 may be formed between the seventh gate electrode 470 and the fourth gate electrode 420.

Further, as illustrated in FIG. 16, the distance S1 between the first gate electrode 120 and the second gate electrode 220 may be substantially equal to the distance S3 between the fourth gate electrode 420 and the fifth gate electrode 520.

The fourth gate spacers 431, 432 may be disposed on the substrate 100. The fourth gate spacers 431, 432 may include a fourth one-side spacer 431 disposed on the first sidewall 420a of the fourth gate electrode and a fourth other-side spacer 432 disposed on the second sidewall 420c of the fourth gate electrode.

The fourth one-side spacer 431 and the fourth other-side spacer 432 may define a fourth trench 421.

The fifth gate spacers 531, 532 may be formed on the substrate 100. The fifth gate spacers 531, 532 may include a fifth one-side spacer 531 disposed on the first sidewall 520a of the fifth gate electrode and a fifth other-side spacer 532 disposed on the second sidewall 520c of the fifth gate electrode.

The fifth one-side spacer 531 and the fifth other-side spacer 532 may define a fifth trench 521.

The fourth gate insulating layer 425 may be formed along the sidewall and the bottom surface of the fourth trench 421, and the fifth gate insulating layer 525 may be formed along the sidewall and the bottom surface of the fifth trench 521.

A second source/drain region 440 may be formed adjacent to the fourth gate electrode 420 and the fifth gate electrode 520.

The second interlayer insulating layer 480 may be formed on the substrate 100 of the second region II. The second interlayer insulating layer 480 may surround the outer sidewalls of the fourth gate spacers 431, 432 and the outer sidewalls of the fifth gate spacers 531, 532.

As illustrated, the upper surface of the second interlayer insulating layer 480 may be positioned in the same plane as the upper surface of the fourth gate electrode 420 and the upper surface of the fifth gate electrode 520, but example embodiments are not limited thereto.

Hereinbelow, it is assumed that the second interlayer insulating layer 480 includes the same material as the first interlayer insulating layer 180, but example embodiments are not limited thereto.

According to the present example embodiment, the first interlayer insulating layer 180 formed in the first region I may include an element semiconductor material, and the second interlayer insulating layer 480 formed in the second region II may not include the element semiconductor material.

A portion of the first interlayer insulating layer 180 (e.g., lower portion 180a of the first interlayer insulating layer), which does not including the element semiconductor material, may have, for example, tensile stress characteristic.

In this case, the width of the fourth trench 421 and the width of the fifth trench 521 may increase with increasing distance from the upper surface of the substrate 100.

The sidewall of the fourth trench 421 as defined by the fourth one-side spacer 431, and the sidewall of the fourth trench 421 as defined by the fourth other-side spacer 432 may have slopes at an obtuse angle with the bottom surface of the fourth trench 421, respectively.

Description of the fifth trench 521 may be the same as or substantially similar to that of the fourth trench 421.

The first sidewall 420a of the fourth gate electrode and the second sidewall 420c of the fourth gate electrode may have slopes at an obtuse angle with the bottom surface 420b of the fourth gate electrode.

Description of the fifth gate electrode 520 may be the same as or substantially similar to that of the fourth gate electrode 420.

The first sidewall 420a of the fourth gate electrode, the second sidewall 420c of the fourth gate electrode, the first sidewall 520a of the fifth gate electrode, the second sidewall 520c of the fifth gate electrode, the sidewall of the fourth trench 421, and the sidewall of the fifth trench 521 may have positive slopes, respectively.

The widths of the first trench 121 and the second trench 221 may be constant with increasing distance from the upper surface of the substrate 100. Further, the widths of the first gate electrode 120 and the second gate electrode 220 may be constant with increasing distance from the upper surface of the substrate 100.

That is, the sign of the slope of the sidewall of the first trench 121 in the first region I may be different from the sign of the slope of the sidewall of the fourth trench 421 in the second region II.

According to some example embodiments, the second interlayer insulating layer 480, and the first interlayer insulating layer 180 that does not include the element semiconductor material may have neutral stress characteristic.

In such cases, the widths of the fourth trench 421 and the fifth trench 521 may be substantially constant with increasing distance from the upper surface of the substrate 100. Further, the widths of the fourth gate electrode 420 and the fifth gate electrode 520 may be constant with increasing distance from the upper surface of the substrate 100.

The widths of the first trench 121 and the second trench 221 may decrease with increasing distance from the upper surface of the substrate 100. Further, the widths of the first gate electrode 120 and the second gate electrode 220 may decrease with increasing distance from the upper surface of the substrate 100.

Figure 18A:
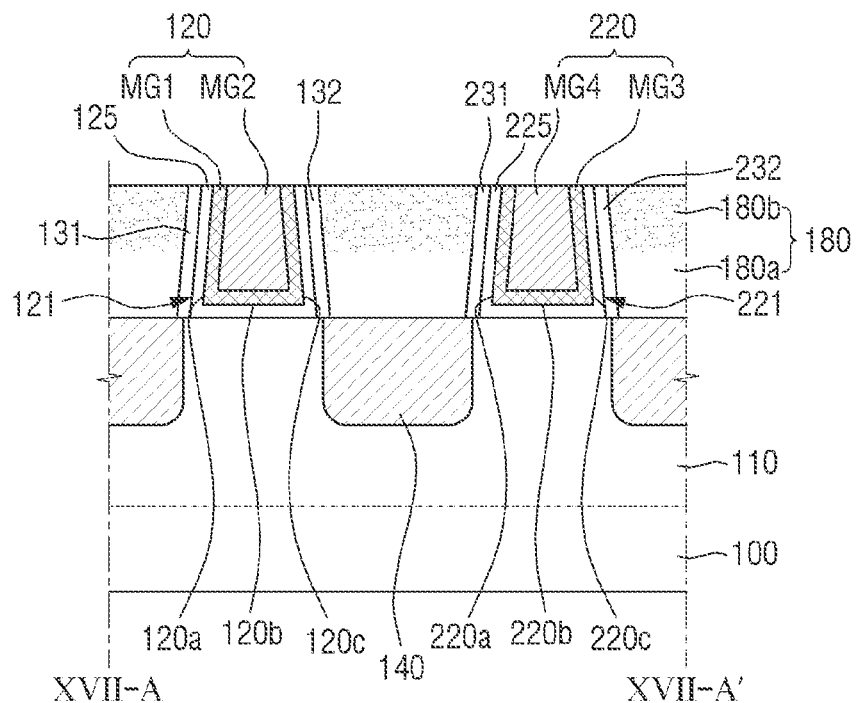
FIGS. 18A and 18B are cross-sectional views taken along lines XVII-A-XVII-A' and XVII-D-XVII-D' of FIG. 16, according to an example embodiment.
Figure 18B:
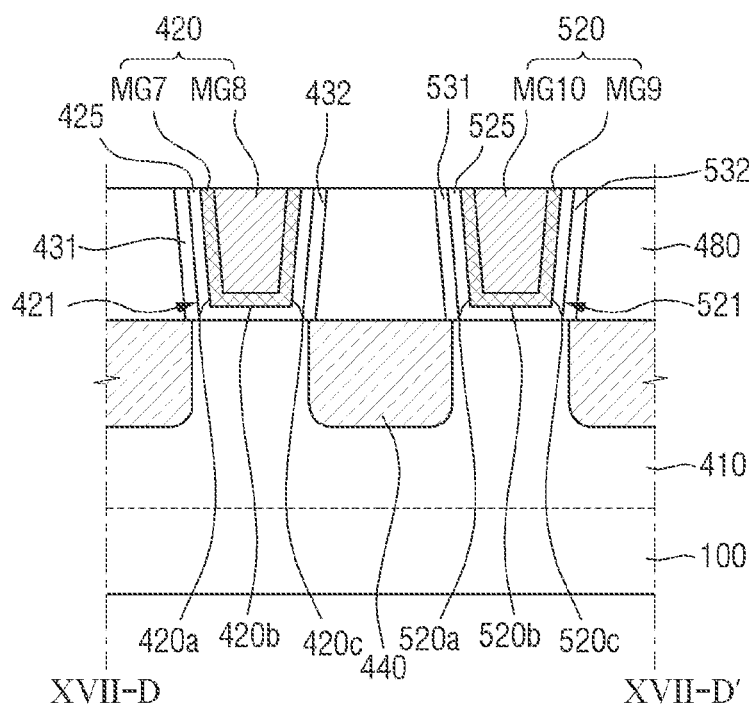

FIGS. 18A and 18B are cross-sectional views taken along lines XVII-A-XVII-A' and XVII-D-XVII-D' of FIG. 16, according to an example embodiment. For convenience of explanation, differences that are not explained above with reference to FIGS. 16, 17A and 17B will be mainly explained below.

Referring to FIGS. 18A and 18B, in a semiconductor device according to the present example embodiment, the width of the first trench 121 and the width of the second trench 221 may decrease with increasing distance from the upper surface of the substrate 100.

Further, the widths of the first gate electrode 120 and the second gate electrode 220 may decrease with increasing distance from the upper surface of the substrate 100.

The sidewall of the first trench 121 defined by the first one-side spacer 131, and the sidewall of the first trench 121 defined by the first other-side spacer 132 may have slopes at an acute angle (e.g., negative slopes) with the bottom surface of the first trench 121, respectively.

Accordingly, the sign of the slope of the sidewall of the first trench 121 in the first region I may be different from the sign of the slope of the sidewall of the fourth trench 421 in the second region II.

Figure 19A:
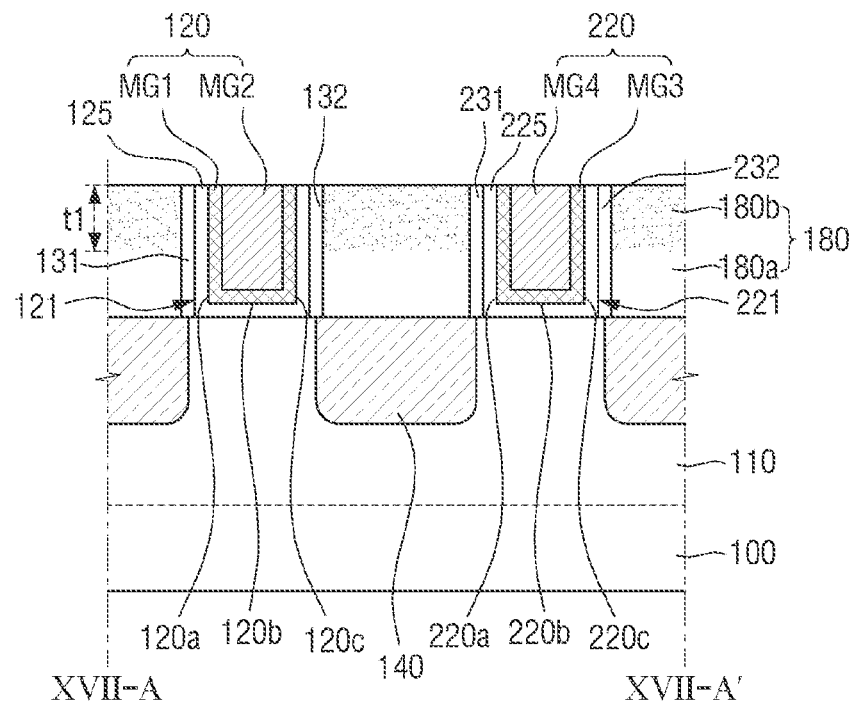
FIGS. 19A and 19B are cross-sectional views taken along lines XVII-A-XVII-A' and XVII-D-XVII-D' of FIG. 16, according to an example embodiment.
Figure 19B:
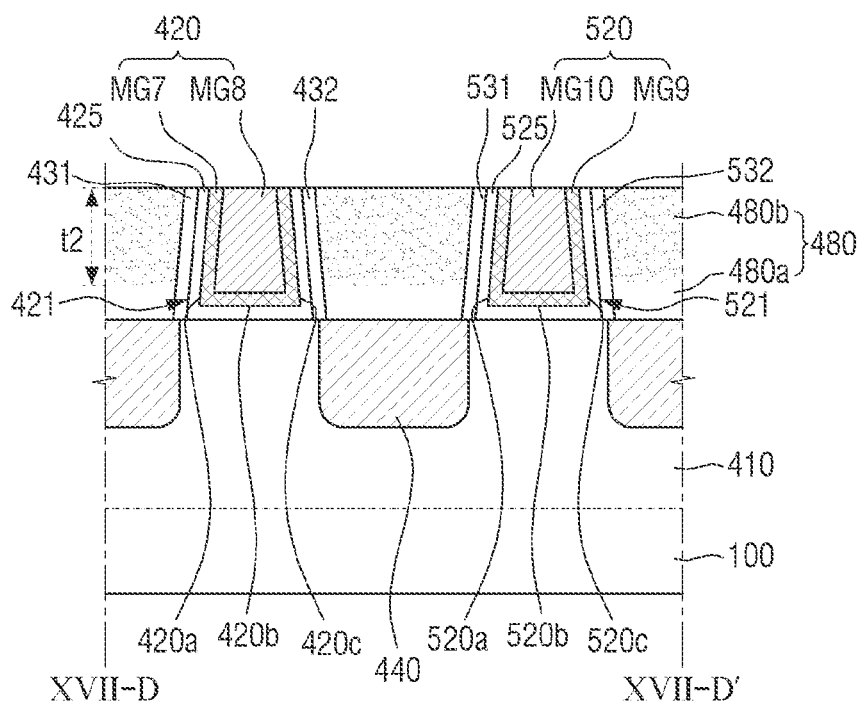

FIGS. 19A and 19B are cross-sectional views taken along lines XVII-A-XVII-A' and XVII-D-XVII-D' of FIG. 16, according to an example embodiment. For convenience of explanation, differences that are not explained above with reference to FIGS. 16, 17A and 17B will be mainly explained below.

Referring to FIG. 19B, in a semiconductor device according to the present example embodiment, at least a portion of the second interlayer insulating layer 480 may include an element semiconductor material.

For example, as illustrated in FIG. 19B, a portion of the second interlayer insulating layer 480 may include the element semiconductor material, and the rest of the second interlayer insulating layer 480 may not include the element semiconductor material.

Referring to FIGS. 19A and 19B, the first interlayer insulating layer 180 may include the upper portion 180b including an element semiconductor material, and the lower portion 180a not including an element semiconductor material. The second interlayer insulating layer 480 may include an upper portion 480b including an element semiconductor material, and a lower portion 480a not including an element semiconductor material.

The concentration profile of the element semiconductor material included in the first interlayer insulating layer 180 may have the same as or similar to the concentration profile of the interlayer insulating layer 180 illustrated in FIG. 4. The concentration profile of the element semiconductor material included in the second interlayer insulating layer 480 may have the same as or similar to the concentration profile of the interlayer insulating layer 180 illustrated in FIG. 4.

The thickness t1 of the upper portion 180b of the first interlayer insulating layer including the element semiconductor material, and the thickness t2 of the upper portion 480b of the second interlayer insulating layer may be different.

For example, the thickness t1 of the upper portion 180b of the first interlayer insulating layer may be less than the thickness t2 of the upper portion 480b of the second interlayer insulating layer.

Because the thickness t2 of the upper portion 480b of the second interlayer insulating layer is greater than the thickness t1 of the upper portion 180b of the first interlayer insulating layer, the volume of the upper portion 480b of the second interlayer insulating layer may be greater than the volume of the upper portion 180b of the first interlayer insulating layer.

Accordingly, the force with which the second interlayer insulating layer 480 pushes the fourth gate spacers 431, 432 may be greater than the force with which the first interlayer insulating layer 180 pushes the first gate spacers 131, 132.

Accordingly, the widths of the first trench 121 and the second trench 221 may be substantially constant with increasing distance from the upper surface of the substrate 100. Further, the widths of the first gate electrode 120 and the second gate electrode 220 may be constant with increasing distance from the upper surface of the substrate 100.

The widths of the fourth trench 421 and the fifth trench 521 may decrease with increasing distance from the upper surface of the substrate 100. Further, the widths of the fourth gate electrode 420 and the fifth gate electrode 520 may decrease with increasing distance from the upper surface of the substrate 100.

That is, the sign of the slope of the sidewall of the first trench 121 in the first region I may be different from the sign of the slope of the sidewall of the fourth trench 421 in the second region II.

According to some example embodiments, the widths of the first trench 121 and the second trench 221 may increase and the widths of the fourth trench 421 and the fifth trench 521 may be substantially constant with increasing distance from the upper surface of the substrate 100. Further, the widths of the first gate electrode 120 and the second gate electrode 220 may increase and the widths of the fourth gate electrode 420 and the fifth gate electrode 520 may be substantially constant with increasing distance from the upper surface of the substrate 100.

Figure 21:
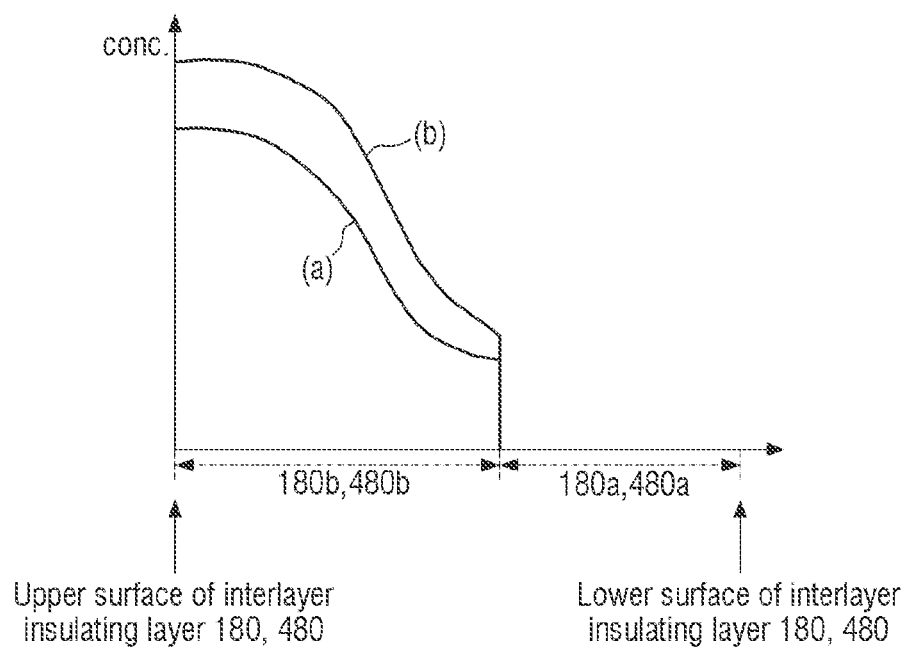
FIG. 21 is a view schematically illustrating a concentration profile of an element semiconductor material within a first interlayer insulating layer and a second interlayer insulating layer.

FIGS. 20A and 20B are cross-sectional views taken along lines XVII-A-XVII-A' and XVII-D-XVII-D' of FIG. 16, according to an example embodiment. FIG. 21 is a view schematically illustrating a concentration profile of an element semiconductor material within a first interlayer insulating layer and a second interlayer insulating layer. For convenience of explanation, differences that are not explained above with reference to FIGS. 16, 17A and 17B will be mainly explained below.

For reference, the graph (a) of FIG. 21 represents a concentration profile of the element semiconductor material in the first interlayer insulating layer 180, and the graph (b) of FIG. 21 represents a concentration profile of the element semiconductor material in the second interlayer insulating layer 480.

Referring to FIGS. 20A, 20B, and 21, in a semiconductor device according to the present example embodiments, the second interlayer insulating layer 480 may include an upper portion 480b including an element semiconductor material, and a lower portion 480a not including an element semiconductor material. The first interlayer insulating layer 180 may include the upper portion 180b including an element semiconductor material, and the lower portion 180a not including an element semiconductor material.

For example, a thickness of the upper portion 180b of the first interlayer insulating layer including the element semiconductor material and a thickness of the upper portion 480b of the second interlayer insulating layer may be substantially same.

The amount of element semiconductor material included in the upper portion 180b of the first interlayer insulating layer may be different from the amount of element semiconductor material included in the upper portion 480b of the second interlayer insulating layer. For example, the amount of element semiconductor material included in the upper portion 180b of the first interlayer insulating layer may be less than the amount of element semiconductor material included in the upper portion 480b of the second interlayer insulating layer.

Because the thickness of the upper portion 480b of the second interlayer insulating layer and the thickness of the upper portion 180b of the first interlayer insulating layer are substantially same, the volume of the upper portion 480b of the second interlayer insulating layer and the volume of the upper portion 180b of the first interlayer insulating layer may be same.

Because the amount of element semiconductor material included in the upper portion 480b of the second interlayer insulating layer is greater than the amount of element semiconductor material included in the upper portion 180b of the first interlayer insulating layer, the upper portion 480b of the second interlayer insulating layer may have a greater compressive stress characteristic than the upper portion 180b of the first interlayer insulating layer.

Accordingly, the force with which the second interlayer insulating layer 480 pushes the fourth gate spacers 431, 432 may be greater than the force with which the first interlayer insulating layer 180 pushes the first gate spacers 131, 132.

Accordingly, the widths of the first trench 121 and the second trench 221 may be substantially constant and the widths of the fourth trench 421 and the fifth trench 521 may decrease with increasing distance from the upper surface of the substrate 100. Further, the widths of the first gate electrode 120 and the second gate electrode 220 may be substantially constant and the widths of the fourth gate electrode 420 and the fifth gate electrode 520 may decrease with increasing distance from the upper surface of the substrate 100.

Therefore, the sign of the slope of the sidewall of the first trench 121 in the first region I may be different from the sign of the slope of the sidewall of the fourth trench 421 in the second region II.

Figure 22A:
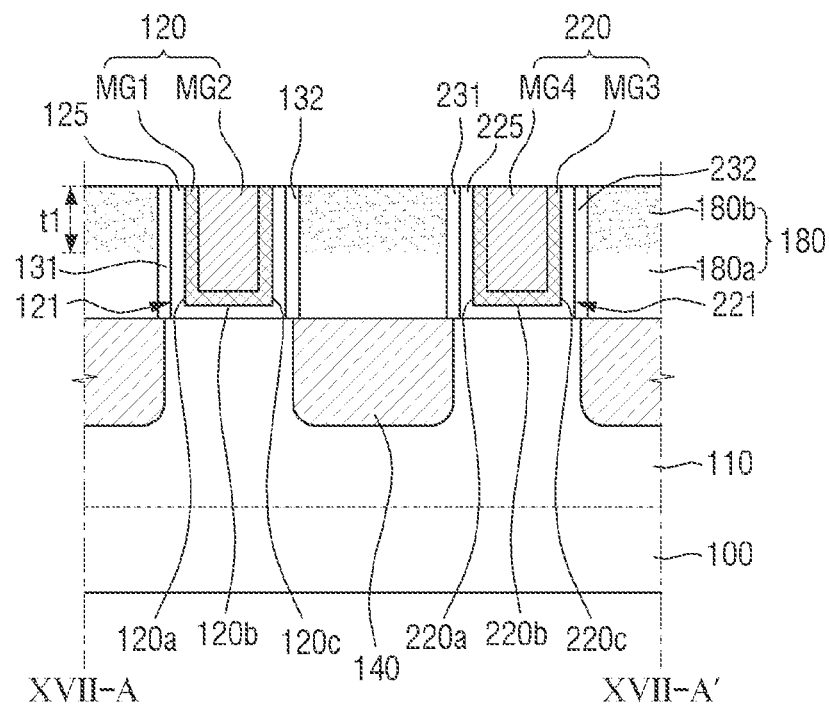
FIGS. 22A and 22B are cross-sectional views illustrating a semiconductor device taken along lines XVII-A-XVII-A' and XVII-D-XVII-D' of FIG. 16, according to an example embodiment.
Figure 22B:
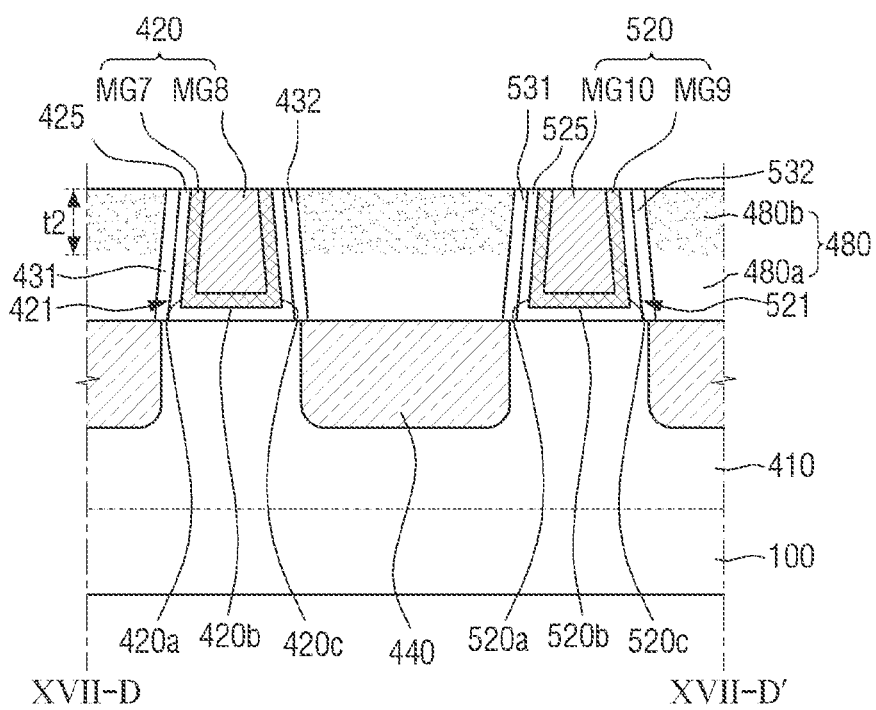

FIGS. 22A and 22B are cross-sectional views of a semiconductor device taken along lines XVII-A-XVII-A' and XVII-D-XVII-D' of FIG. 16, according to an example embodiment. For convenience of explanation, differences that are not explained above with reference to FIGS. 16 and 17 will be mainly explained below.

Referring to FIGS. 22A and 22B, in a semiconductor device according to the present example embodiment, the distance S1 between the first gate electrode 120 and the second gate electrode 220 may be different from the distance S3 between the fourth gate electrode 420 and the fifth gate electrode 520.

For example, the distance S1 between the first gate electrode 120 and the second gate electrode 220 may be less than the distance S3 between the fourth gate electrode 420 and the fifth gate electrode 520.

The first interlayer insulating layer 180 may include the upper portion 180b including an element semiconductor material, and the lower portion 180a not including an element semiconductor material. Further, the second interlayer insulating layer 480 may include an upper portion 480b including an element semiconductor material, and a lower portion 480a not including an element semiconductor material. For example, the thickness t1 of the upper portion 180b of the first interlayer insulating layer including the element semiconductor material and the thickness t2 of the upper portion 480b of the second interlayer insulating layer may be substantially same.

The concentration profile of the element semiconductor material included in the second interlayer insulating layer 480 may be the same as or similar to the concentration profile of the element semiconductor material included in the first interlayer insulating layer 180.

In such case, because the distance S1 between the first gate electrode 120 and the second gate electrode 220 is smaller than the distance S3 between the fourth gate electrode 420 and the fifth gate electrode 520, the volume of the upper portion 480b of the second interlayer insulating layer may be greater than the volume of the upper portion 180b of the first interlayer insulating layer.

Accordingly, the force with which the second interlayer insulating layer 480 pushes the fourth gate spacers 431, 432 may be greater than the force with which the first interlayer insulating layer 180 pushes the first gate spacers 131, 132.

Accordingly, the widths of the first trench 121 and the second trench 221 may be substantially constant and the widths of the fourth trench 421 and the fifth trench 521 may decrease with increasing distance from the upper surface of the substrate 100. Further, the widths of the first gate electrode 120 and the second gate electrode 220 may be substantially constant and the widths of the fourth gate electrode 420 and the fifth gate electrode 520 may decrease with increasing distance from the upper surface of the substrate 100.

Therefore, the sign of the slope of the sidewall of the first trench 121 in the first region I may be different from the sign of the slope of the sidewall of the fourth trench 421 in the second region II.

Figure 23:
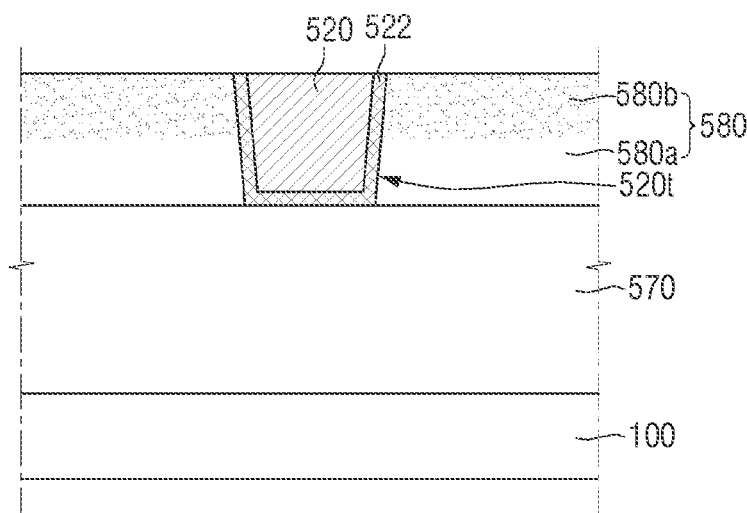
FIG. 23 is a view illustrating a semiconductor device according to an example embodiment.

FIG. 23 is a view illustrating a semiconductor device according to an example embodiment.

Referring to FIG. 23, the semiconductor device according to the present example embodiments may include a lower layer 670, a third interlayer insulating layer 680, and a conductive wire 620.

The lower layer 670 may be formed on the substrate 100. For example, the lower layer 670 may include a circuit element pattern (e.g., transistor or diode), and/or a wiring pattern which electrically connects the circuit element pattern.

The third interlayer insulating layer 680 may be formed on the lower layer 670. The third interlayer insulating layer 680 may include a sixth trench 620t. The third interlayer insulating layer 680 may include low-k dielectric material.

The third interlayer insulating layer 680 may include an upper portion 680b including an element semiconductor material, and a lower portion 680a.

The barrier layer 622 may be formed along the sidewall and the bottom surface of the sixth trench 620t.

The conductive wire 620 is formed on the barrier layer 622. The conductive wire 620 may fill the sixth trench 620t.

Figure 24A:
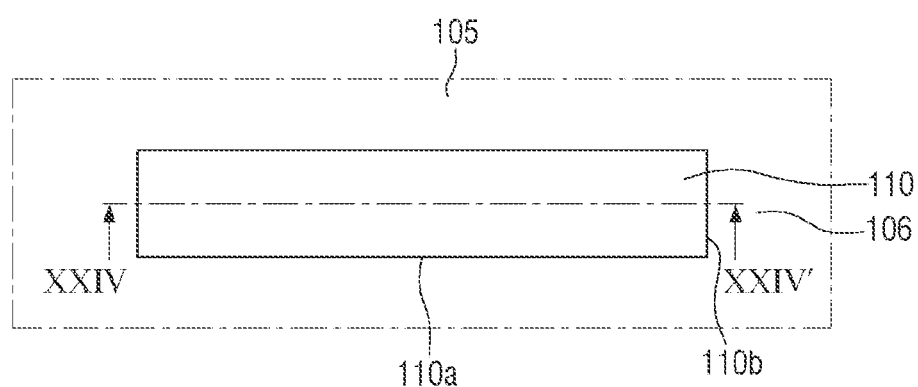
FIG. 24A is a top view of a fin-type pattern surrounded by field insulating layers, according an example embodiment.
Figure 24B:
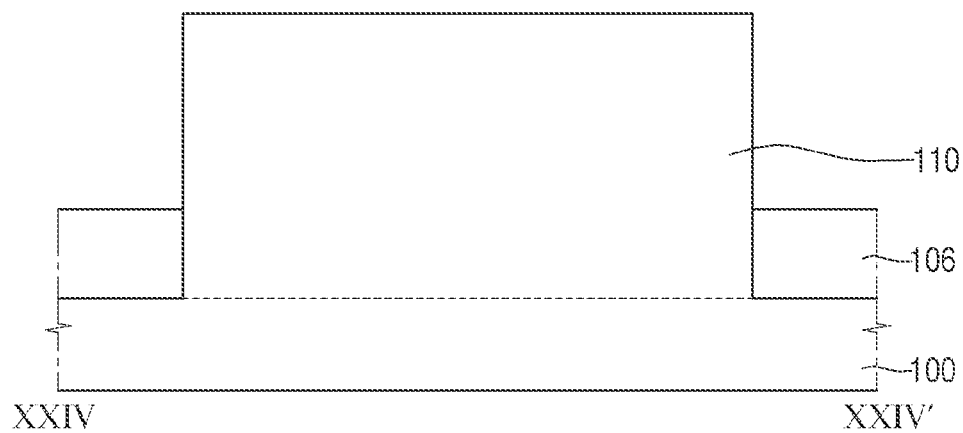
FIG. 24B is a cross-sectional view taken on line—XXIV-XXIV' of FIG. 24A.

FIG. 24A is a top view of a fin-type pattern surrounded by field insulating layers, according an example embodiment. FIG. 24B is a cross-sectional view taken along line—XXIV-XXIV' of FIG. 24A FIGS. 25 to 31 are views of intermediate stages of fabrication, illustrating a method of fabricating a semiconductor device according to an example embodiment.

Referring to FIGS. 24A and 24B, the first fin-type pattern 110 may be formed on the substrate 100. The first fin-type pattern 110 may extend longitudinally in one direction. The first fin-type pattern 110 may include a long side 110a and a short side 110b.

The first and the second field insulating layers 105, 106 may be formed on the substrate 100. The first field insulating layer 105 may be formed on the long side 110a portion of the first fin-type pattern 110, and the second field insulating layer 106 may be formed on the short side 110b portion of the first fin-type pattern 110.

The first and the second field insulating layers 105, 106 may surround a portion of the first fin-type pattern 110. That is, the first fin-type pattern 110 may include a portion that protrudes upward higher than the upper surface of the first and the second field insulating layers 105, 106.

The following description refers to the cross-sectional view taken along line XXIV-XXIV' of FIG. 24A.

Figure 25:
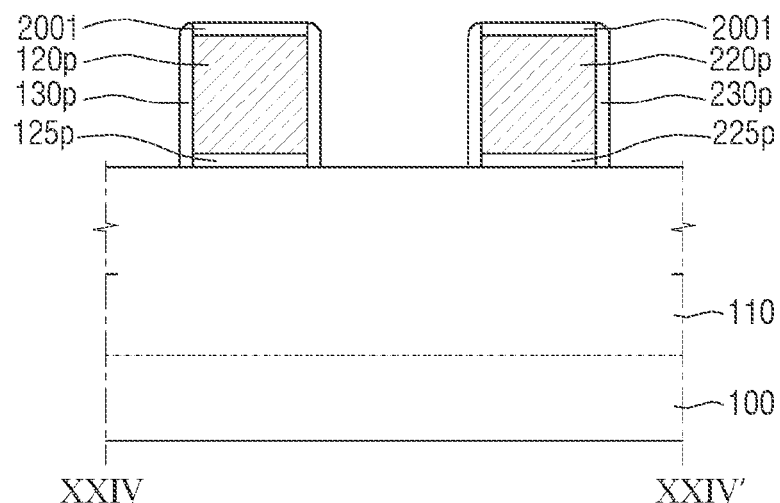
FIGS. 25 to 31 are views illustrating a method of fabricating a semiconductor device according to an example embodiment.

Referring to FIG. 25, etching process may be performed using a mask pattern 200l, thus forming a first dummy gate electrode 120p and a second dummy gate electrode 220p. The first dummy gate electrode 120p and the second dummy gate electrode 220p may intersect the first fin-type pattern 110.

Further, the first dummy gate insulating layer 125p may be formed between the first dummy gate electrode 120p and the first fin-type pattern 110, and the second dummy gate insulating layer 225p may be formed between the second dummy gate electrode 220p and the first fin-type pattern 110.

For example, the first and the second dummy gate insulating layers 125p, 225p may be silicon oxide layers, and the first and the second dummy gate electrodes 120p, 220p may include polysilicon or amorphous silicon, although example embodiments are not limited thereto.

Next, a first pre-spacer 130p may be formed on the sidewall of the first dummy gate electrode 120p, and a second pre-spacer 230p may be formed on the sidewall of the second dummy gate electrode 220p.

Figure 26:
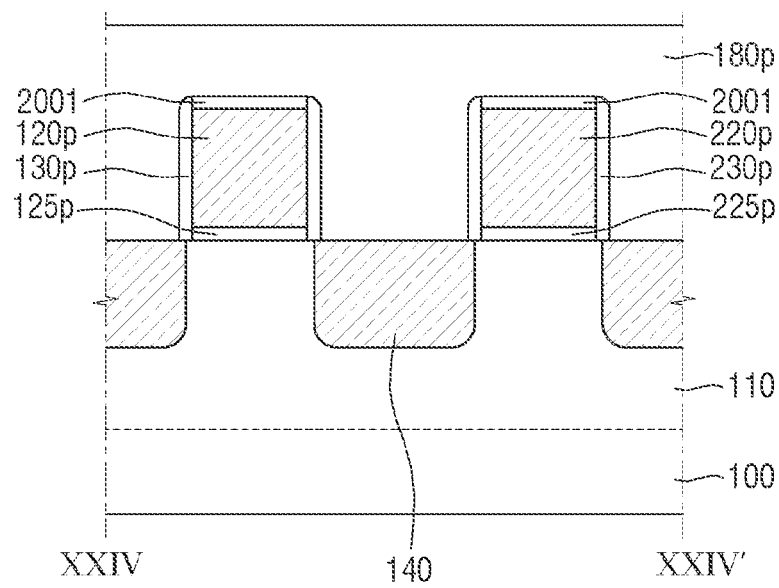

Referring to FIG. 26, the first source/drain region 140 may be formed within the first fin-type pattern 110 which is not intersected with the first dummy gate electrode 120p and the second dummy gate electrode 220p.

Next, a pre-interlayer insulating layer 180p covering the first dummy gate electrode 120p and the second dummy gate electrode 220p may be formed. The pre-interlayer insulating layer 180p may be covering the upper surface of the mask pattern 200l.

Figure 27:
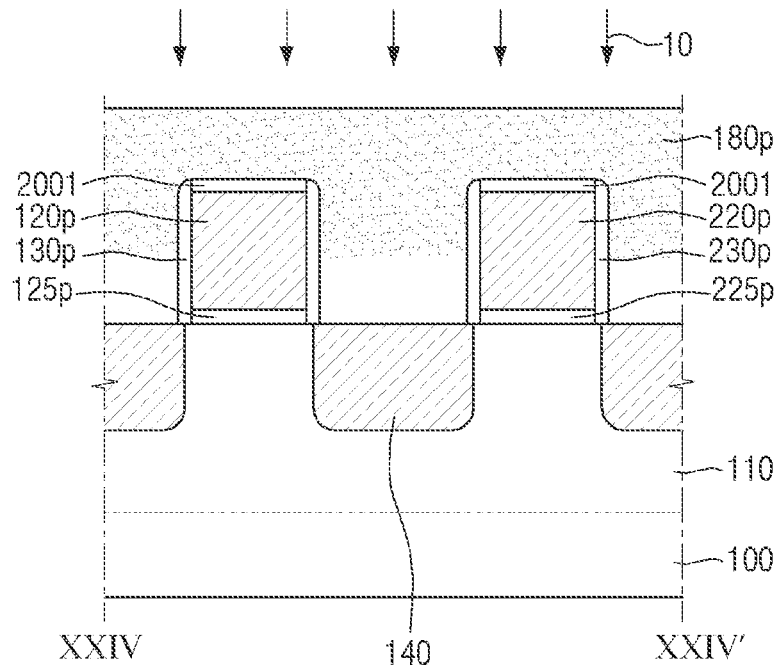

Referring to FIG. 27, an element semiconductor material may be implanted into the pre-interlayer insulating layer 180p.

For example, the implantation process 10 may include ion implantation, plasma doping, immersion layer doping, and so on, but not limited thereto. That is, a method of implanting an element semiconductor material into the pre-interlayer insulating layer 180p may be used as the implantation process 10.

For example, when ion implantation process is used as the implantation process 10, a dose or a depth of implant may be adjusted. By way of adjusting dose of implant or depth of implant, the thickness of the upper portion 180b of the first interlayer insulating layer in FIG. 2 may be adjusted, or the amount of element semiconductor material included in the upper portion 180b of the first interlayer insulating layer may be adjusted.

Figure 28:
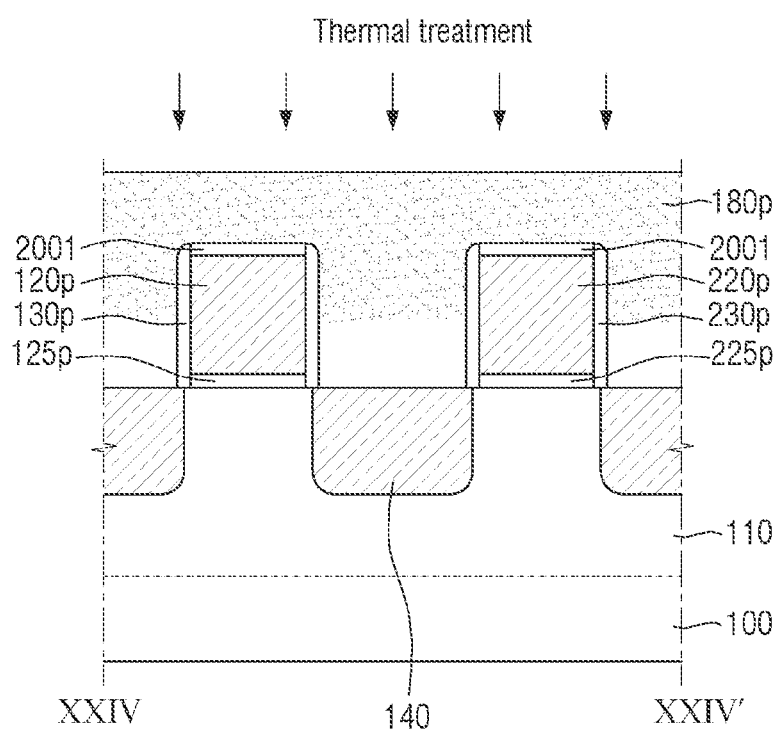

Referring to FIG. 28, the pre-interlayer insulating layer 180p may be subject to thermal treatment. By the thermal treatment, the element semiconductor material implanted into the pre-interlayer insulating layer 180p may be oxidized.

The thermal treatment may be performed at least once or more. For example, ultraviolet ray, plasma, direct heat, or laser may be used for the thermal treatment, although example embodiments are not limited thereto.

Referring to FIG. 29, the pre-interlayer insulating layer 180p may be planarized until the upper surfaces of the first and the second dummy gate electrodes 120p, 220p are exposed.

As a result, the first interlayer insulating layer 180 exposing the first and the second dummy gate electrodes 120p, 220p, may be formed. Further, when the first and the second dummy gate electrodes 120p, 220p are exposed, the first gate spacers 131, 132 and the second gate spacers 231, 232 may be formed on the sidewalls of the first and the second dummy gate electrodes 120p, 220p.

The first interlayer insulating layer 180 may include an upper portion 180b including an element semiconductor material, and a lower portion 180a not including an element semiconductor material.

Referring to FIG. 30, the first and the second dummy gate electrodes 120p, 220p and the first and the second dummy gate insulating layers 125p, 225p may be removed.

As a result, the first trench 121 defined by the first gate spacers 131, 132, and the second trench 221 defined by the second gate spacers 231, 232 may be formed.

Figure 31:
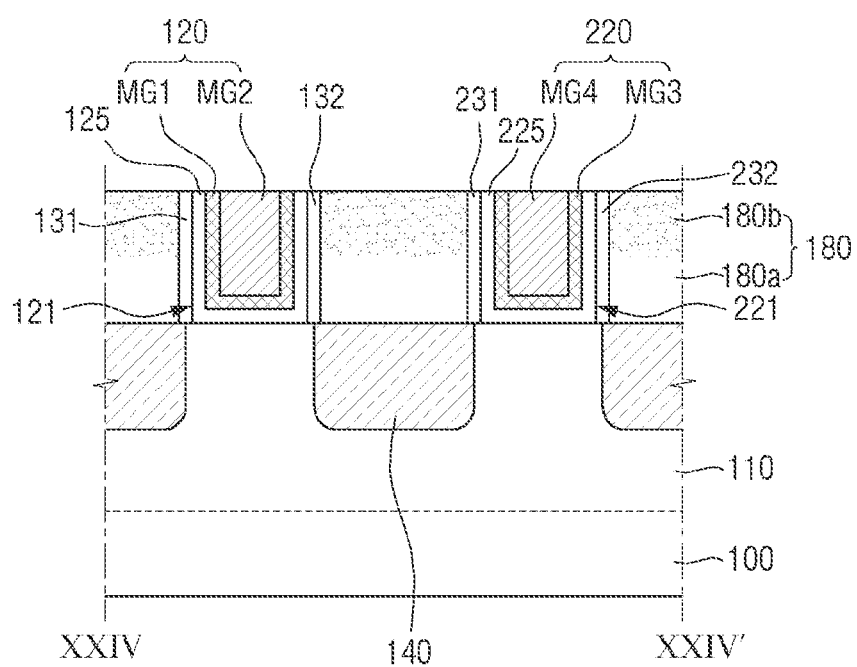

Referring to FIG. 31, the first gate electrode 120 filling the first trench 121 and the second trench 221 may be formed.

Figure 32:
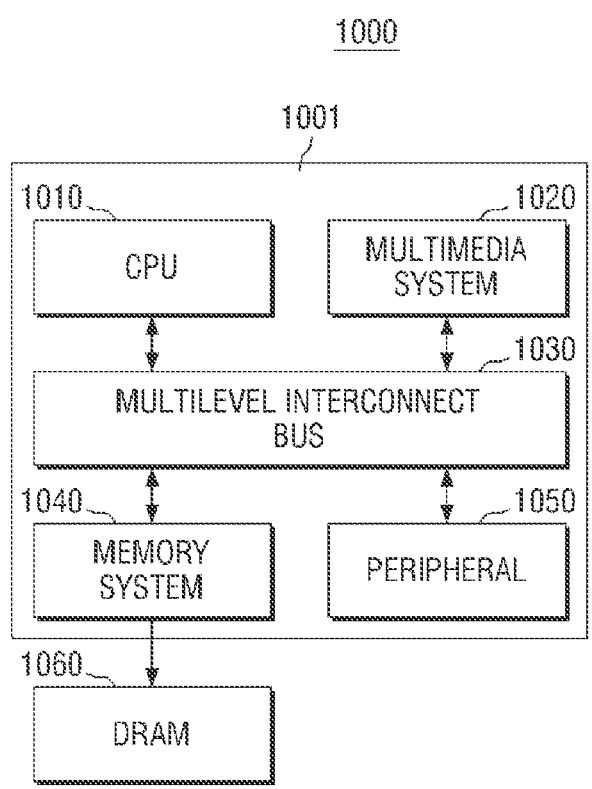
FIG. 32 is a block diagram of an SoC system comprising a semiconductor device according to an example embodiment.

FIG. 32 is a block diagram of an SoC system comprising a semiconductor device according to an example embodiment.

Referring to FIG. 32, the SoC system 1000 includes an application processor 1001 and a dynamic random-access memory (DRAM) 1060.

The application processor 1001 may include a central processing unit (CPU) 1010, a multimedia system 1020, a bus 1030, a memory system 1040 and a peripheral circuit 1050.

The CPU 1010 may perform arithmetic operation necessary for driving of the SoC system 1000. In some example embodiments, the CPU 1010 may be configured on a multi-core environment which includes a plurality of cores.

The multimedia system 1020 may be used for performing a variety of multimedia functions on the SoC system 1000. Such multimedia system 1020 may include a three-dimensional (3D) engine module, a video codec, a display system, a camera system, a post-processor, and so on.

The bus 1030 may be used for exchanging data communication among the CPU 1010, the multimedia system 1020, the memory system 1040 and the peripheral circuit 1050. In some example embodiments, the bus 1030 may have a multi-layer structure. For example, an example of the bus 1030 may be a multi-layer advanced high-performance bus (AHB), or a multi-layer advanced eXtensible interface (AXI), although example embodiments are not limited herein.

The memory system 1040 may provide environments for the application processor 1001 to connect to an external memory (e.g., DRAM 1060) and perform high-speed operation. In some example embodiments, the memory system 1040 may include a separate controller (e.g., DRAM controller) to control an external memory (e.g., DRAM 1060).

The peripheral circuit 1050 may provide environments for the SoC system 1000 to have a seamless connection to an external device (e.g., main board). Accordingly, the peripheral circuit 1050 may include a variety of interfaces to allow compatible operation with the external device connected to the SoC system 1000.

The DRAM 1060 may function as an operation memory necessary for the operation of the application processor 1001. In some example embodiments, the DRAM 1060 may be arranged externally to the application processor 1001, as illustrated. For example, the DRAM 1060 may be packaged into a package on package (PoP) type with the application processor 1001.

At least one of the above-mentioned components of the SoC system 1000 may include at least one of the semiconductor devices according to the example embodiments explained above.

In concluding the detailed description, those skilled in the art will appreciate that many variations and modifications can be made to the example embodiments without substantially departing from the principles of the present inventive concepts. Therefore, the disclosed preferred example embodiments of the inventive concepts are used in a generic and descriptive sense only and not for purposes of limitation.

What is claimed is:

1. A semiconductor device, comprising:
a substrate including a first region and a second region;
a first gate spacer on the first region, the first gate spacer defining a first trench;
a second gate spacer on the second region, the second gate spacer defining a second trench;
a first gate electrode filling the first trench;
a second gate electrode filling the second trench;
a first interlayer insulating layer on the substrate, the first interlayer insulating layer surrounding the first gate spacer; and
a second interlayer insulating layer on the substrate, the second interlayer insulating layer surrounding the second gate spacer,
wherein the first interlayer insulating layer and the second interlayer insulating layer each includes a lower portion and an upper portion,
the upper portion of the first interlayer insulating layer and the upper portion of the second interlayer insulating layer each include germanium, and
the lower portion of the first interlayer insulating layer and the lower portion of the second interlayer insulating layer each do not include germanium.

2. The semiconductor device of claim 1, wherein with increasing distance from the substrate, a width of the first trench is substantially same, and a width of the second trench increases.

3. The semiconductor device of claim 1, wherein with increasing distance from the substrate, a width of the first trench decreases, and a width of the second trench increases.

4. The semiconductor device of claim 1, wherein a thickness of the upper portion of the first interlayer insulating layer is less than a thickness of the upper portion of the second interlayer insulating layer.

5. The semiconductor device of claim 4, wherein with increasing distance from the substrate, a width of the first trench is substantially same, and a width of the second trench decreases.

6. The semiconductor device of claim 1, wherein an amount of the germanium included in the upper portion of the first interlayer insulating layer is less than an amount of the germanium included in the upper portion of the second interlayer insulating layer.

7. The semiconductor device of claim 6, wherein with increasing distance from the substrate, a width of the first trench is substantially same, and a width of the second trench decreases.

8. The semiconductor device of claim 1, further comprising:
a first fin-type pattern and a second fin-type pattern both protruding from the substrate, wherein the first gate electrode intersects with the first fin-type pattern, and the second gate electrode intersects with the second fin-type pattern.

9. A semiconductor device, comprising:
a substrate including a first region and a second region;
a first gate spacer on the first region, the first gate spacer defining a first trench, a sidewall of the first trench having a slope of a first sign with respect to a bottom surface of the first trench;
a second gate spacer on the second region, the second gate spacer defining a second trench, a sidewall of the second trench having a slope of a second sign with respect to a bottom surface of the second trench, the second sign being opposite to the first sign;
a first gate electrode filling the first trench;
a second gate electrode filling the second trench; and
an interlayer insulating layer on the substrate, the interlayer insulating layer surrounding the first gate spacer and the second gate spacer, the interlayer insulating layer including a first portion having an element semiconductor material,
wherein a thickness of the first portion of the interlayer insulating layer in the first region is different from a thickness of the first portion of the interlayer insulating layer in the second region.

10. The semiconductor device of claim 9, wherein the element semiconductor material comprises at least one of germanium (Ge) or silicon (Si).

11. The semiconductor device of claim 9, wherein the interlayer insulating layer include a second portion which does not include the element semiconductor material.

12. The semiconductor device of claim 9, wherein an amount of the element semiconductor material included in the first portion of the interlayer insulating layer in the first region is different from an amount of the element semiconductor material included in the first portion of the interlayer insulating layer in the second region.

13. The semiconductor device of claim 9, further comprising:
a third gate electrode on the first region, the third gate electrode being adjacent to the first gate electrode; and
a fourth gate electrode on the second region, the fourth gate electrode being adjacent to the second gate electrode,
wherein a spacing between a bottom surface of the first gate electrode and a bottom surface of the third gate electrode is different from a spacing between a bottom surface of the second gate electrode and a bottom surface of the fourth gate electrode.

14. The semiconductor device of claim 13, wherein a thickness of the first portion of the interlayer insulating layer in the first region is substantially same as a thickness of the first portion of the interlayer insulating layer in the second region.

* * * * *